US006933168B2

(12) United States Patent
Bawolek et al.

(10) Patent No.: US 6,933,168 B2
(45) Date of Patent: Aug. 23, 2005

(54) METHOD AND APPARATUS FOR EMPLOYING A LIGHT SHIELD TO MODULATE PIXEL COLOR RESPONSIVITY

(75) Inventors: Edward J. Bawolek, Chandler, AZ (US); Lawrence T. Clark, Phoenix, AZ (US); Mark A. Beiley, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 636 days.

(21) Appl. No.: 09/802,464

(22) Filed: Mar. 9, 2001

(65) Prior Publication Data

US 2004/0012029 A1 Jan. 22, 2004

Related U.S. Application Data

(60) Continuation of application No. 09/524,081, filed on Mar. 13, 2000, now Pat. No. 6,235,549, which is a division of application No. 08/937,631, filed on Sep. 26, 1997, now Pat. No. 6,057,586.

(51) Int. Cl.[7] ................................................ H01L 21/00

(52) U.S. Cl. ........................... 438/70; 438/69; 257/434; 257/435; 257/440

(58) Field of Search ................................ 257/434, 435, 257/440, 443, 448, 457, 459, 294, 98; 438/48, 69, 70

(56) References Cited

U.S. PATENT DOCUMENTS

| | | | | | |
|---|---|---|---|---|---|
| 3,832,034 | A | * | 8/1974 | Edmonds | 349/44 |
| 4,073,969 | A | * | 2/1978 | Breazeale | 427/75 |
| 4,355,456 | A | * | 10/1982 | Harnagel et al. | 438/64 |
| 4,870,483 | A | * | 9/1989 | Nishigaki et al. | 358/512 |
| 4,882,490 | A | * | 11/1989 | Takasaki et al. | 250/236 |
| 4,908,518 | A | | 3/1990 | Losee et al. | |
| 5,055,921 | A | * | 10/1991 | Usui | 358/512 |
| 5,119,181 | A | * | 6/1992 | Perregaux et al. | 348/275 |
| 5,266,501 | A | * | 11/1993 | Imai | 438/60 |
| 5,274,250 | A | * | 12/1993 | Miyake et al. | 257/59 |
| 5,352,920 | A | * | 10/1994 | Morishita et al. | 257/435 |
| 5,455,415 | A | * | 10/1995 | Yamada et al. | 250/214.1 |
| 5,471,515 | A | | 11/1995 | Fossum et al. | |
| 5,506,430 | A | * | 4/1996 | Ohzu | 257/292 |
| 5,514,888 | A | * | 5/1996 | Sano et al. | 257/232 |
| 5,537,232 | A | | 7/1996 | Biles | |
| 5,552,630 | A | * | 9/1996 | Miyake | 257/435 |
| 5,576,239 | A | * | 11/1996 | Hatano et al. | 438/69 |
| 5,578,842 | A | * | 11/1996 | Shinji | 257/223 |
| 5,602,384 | A | * | 2/1997 | Nunogaki et al. | 250/203.4 |
| 5,686,980 | A | * | 11/1997 | Hirayama et al. | 349/110 |
| 5,719,074 | A | * | 2/1998 | Hawkins et al. | 438/70 |
| 5,854,091 | A | * | 12/1998 | Back et al. | 438/70 |
| 5,914,749 | A | * | 6/1999 | Bawolek et al. | 348/273 |
| 5,962,906 | A | * | 10/1999 | Liu | 257/432 |
| 5,976,908 | A | * | 11/1999 | Kwon et al. | 438/69 |
| 5,986,297 | A | * | 11/1999 | Guidash et al. | 257/223 |
| 6,002,145 | A | * | 12/1999 | Niisoe | 257/222 |
| 6,030,852 | A | * | 2/2000 | Sano et al. | 438/69 |
| 6,137,100 | A | * | 10/2000 | Fossum et al. | 250/280.1 |
| 6,137,634 | A | * | 10/2000 | Li | 359/619 |

FOREIGN PATENT DOCUMENTS

| | | | | |
|---|---|---|---|---|
| JP | 6-151797 | * | 5/1994 | 257/436 |
| JP | 07156632 A | * | 6/1995 | B60H/1/00 |

* cited by examiner

*Primary Examiner*—George Eckert
*Assistant Examiner*—José R. Diaz
(74) *Attorney, Agent, or Firm*—Blakely, Sokoloff, Taylor & Zafman LLP

(57) ABSTRACT

A method and apparatus for employing a light shield to modulate pixel color responsivity. The improved pixel includes a substrate having a photodiode with a light receiving area. A color filter array material of a first color is disposed above the substrate. The pixel has a first relative responsivity. A light shield is disposed above the substrate to modulate the pixel color responsivity. The light shield forms an aperture whose area is substantially equal to the light receiving area adjusted by a reduction factor. The reduction factor is the result of an arithmetic operation between the first relative responsivity and a second relative responsivity, associated with a second pixel of a second color.

4 Claims, 22 Drawing Sheets

$$S_R = \int_{380NM}^{780NM} RESP(\lambda) \times T_R(\lambda) \times IR(\lambda) \times S(\lambda) d\lambda$$

$$S_G = \int_{380NM}^{780NM} RESP(\lambda) \times T_G(\lambda) \times IR(\lambda) \times S(\lambda) d\lambda$$

$$S_B = \int_{380NM}^{780NM} RESP(\lambda) \times T_B(\lambda) \times IR(\lambda) \times S(\lambda) d\lambda$$

METHOD AND APPARATUS FOR EMPLOYING A LIGHT SHIELD TO MODULATE PIXEL COLOR RESPONSIVITY

CROSS-REFERENCE TO RELATED APPLICATION

The application is a Continuation of application Ser. No. 09/524,081, filed Mar. 13, 2000, issued as U.S. Pat. No. 6,235,549, which is a Divisional of application Ser. No. 08/937,631, filed Sep. 26, 1997, issued as U.S. Pat. No. 6,057,586, by applicants, Edward J. Bawolek, Lawrence T. Clark, and Mark A. Beiley, entitled "*Method and Appa ratus for Employing a Light Shield to Modulate Pixel Color Responsivily.*"

BACKGROUND OF THE INVENTION

1. Field of the Invention

The present invention relates generally to color sensors and specifically to a method and apparatus for employing a light shield to modulate a pixel's color responsivity.

2. Description of the Related Art

Imaging devices can typically employ a sensor (not shown) to detect light and, responsive thereto, generate electrical signals representing the light. A sensor typically includes a light sensing element (e.g., a photodiode), and associated circuitry for selectively reading out the electric signal provided by the light sensing circuit. The light sensing circuit operates by the well-known photoelectric effect that transforms light photons into electrons that constitute an electrical signal.

Color imaging devices employ color filter arrays (herein referred to as CFAs) to generate color output. CFAs include a plurality of CFA elements that typically include red, green and blue elements.

FIG. 1 illustrates a perspective view of a conventional imaging device 2 that includes an IR blocking filter 4, a lens assembly 5, and an imager and package 6. The imager and package 6 includes a pixel array 7 having a substrate with an active area 8 and a color filter array 9 disposed thereon.

A CFA element 9 is overlaid on the substrate 8 and covers the light sensing circuit. The combination of the sensor with the corresponding CFA element is often referred to as a pixel. For example, if a red CFA element is overlaid over a light sensing circuit, that pixel is referred to as a red pixel. Similarly, if a green CFA element is overlaid on a light sensing circuit, that pixel is referred to as a green pixel.

There are two primary types of imagers. First, there are those imagers employing CCD (charge coupled device) technology. Second, there are imagers that are made using complementary metal oxide semiconductor (CMOS) processes.

One common problem associated with the use of color filter arrays on CCD and CMOS imagers is that pixel/sensor responsivity varies with the specific type of color.

Generally, the responsivity of a pixel of a first color is different than the responsivity for a pixel of a second color. For example, in a system employing a red color pixel, a green color pixel and a blue color pixel, assuming a uniform integration time (that is, the time of exposure to light being equal), and a typical scene being imaged, the signal to noise (S/N) ratio of the pixels will not be equal due to differing responsivity between the pixels. Blue pixels typically have the least responsivity; consequently, the signal to noise ratio of the blue pixels is less than the signal to noise ratio of the red and green pixels.

Moreover, in capturing an image with equal amounts of red, green and blue light, the pixels having the greatest sensitivity (typically the red and green pixels) saturate first. Specifically, the storage capacitors associated with the red and green pixels reach a maximum capacity of stored photoelectrons (i.e., saturate) before the blue pixels.

Once a pixel saturates, the exposure to light is stopped (by closing a mechanical shutter, for example) to avoid blooming and other saturation artifacts. Blooming is simply a false electrical signal representation of light intensity at a neighboring pixel because of charge leakage from the saturated pixel.

However, stopping the exposure, although preventing blooming and other saturation artifacts, compromises the signal to noise ratio of the pixels with the lowest sensitivity to light (typically the blue pixels). The consequence of stopping the exposure when the red and green pictures are saturated, is that the pixels with the lowest sensitivity (typically the blue pixels) suffer in signal to noise ratio.

Prior art sensors do not compensate for color responsivity variation among the different color pixels. Accordingly, when an exposure is made, the exposure time is adjusted to avoid saturation in the most sensitive pixels. Thus, as a result, blooming is avoided in neighboring pixels. The result of this adjustment in exposure time is a degraded signal to noise (S/N) ratio in the least sensitive pixels (typically the blue pixels).

A conventional approach is to increase the signal to noise ratio of the blue pixels by increasing the integration time (i.e., the exposure time). However, as one increases the exposure time, although the signal to noise ratio of the blue pixels is increased, the red and green pixels saturate and are subject to undesirable saturation artifacts (these undesirable artifacts are commonly referred to in the art as blooming). To counteract the saturation artifacts, the prior art employed anti-blooming mechanisms in the pixels. However, these mechanisms increase the cost and complexity of the color pixels. Moreover, these anti-blooming mechanisms are ineffective to eliminate the blooming effect while still obtaining a desired increase in the signal to noise ratio of the blue pixels.

Accordingly, there remains an unmet need in the industry for a method and apparatus that modifies the responsivity of a color pixel to overcome the disadvantage discussed above.

SUMMARY OF THE INVENTION

A method and apparatus for employing a light shield to modulate pixel color responsivity. The improved pixel includes a substrate having a photodiode with a light receiving area. A color filter array material of a first color is disposed above the substrate. The pixel has a first relative responsivity. A light shield is disposed above the substrate to modulate the pixel color responsivity. The light shield forms an aperture whose area is substantially equal to the light receiving area adjusted by a reduction factor. The reduction factor is the result of an arithmetic operation between the first relative responsivity and a second relative responsivity, associated with a second pixel of a second color.

BRIEF DESCRIPTION OF THE DRAWINGS

The objects, features and advantages of the method and apparatus for the present invention will be apparent from the following description in which:

FIG. 8A illustrates a cross-sectional of the improved pixel cell of the present invention after fabrication of active devices by conventional processing methods.

FIG. 8B illustrates a cross-sectional of the improved pixel cell of the present invention after a first dielectric layer is deposited on the substrate and via lithography and etch have been performed.

FIG. 8C illustrates a cross-sectional view of an improved pixel cell of the present invention after deposition of a metal in the vias and a metal polish.

FIG. 8D illustrates a cross-sectional view of the improved pixel cell of the present invention where a first metal layer is used as a metal shield to modify the color responsivity of the pixel.

FIGS. 9A–9C correspond to FIGS. 8A–8C and the structures shown therein are made with the same processing steps, described in FIGS. 8A–8C.

FIG. 9D illustrates a cross-sectional view of the improved pixel cell of the present invention after a metal one layer has been deposited, and the metal one layer lithography and etch processing steps have been performed.

FIG. 9E illustrates a cross-sectional view of the improved pixel cell of the present invention after 1) a second dieletric layer (IDL1) has been deposited and polished; 2) a via one lithography and etch processing steps have been performed; and 3) a CVD metal deposition and polish have been performed.

FIG. 9F illustrates a cross-sectional view of the improved pixel cell of the present invention after a metal two layer has been deposited, and metal two lithography and etch have been accomplished.

FIG. 9G illustrates a cross-sectional view of the improved pixel cell of the present invention after a third dielectric layer has been deposited and polished; via two lithography and etch steps have been performed (although not shown in this cross-sectional view); and a metal deposition and polish have been performed (although not shown in this cross-sectional view).

FIG. 9H illustrates a cross-sectional view of the improved pixel cell of the present invention after a metal three layer has been deposited, and the metal three lithography and etch processing steps have been performed.

FIG. 9I illustrates a cross-sectional view of the improved pixel cell of the present invention after a fourth dielectric layer has been deposited and polished; a via three lithography and etch processing steps have been performed (although not shown in this cross-sectional view); and a metal deposition and polish have been performed (although not shown in this cross-sectional view).

FIG. 9J illustrates a cross-sectional view of the improved pixel cell of the present invention where the fourth metal layer is employed as a light shield to modify the color responsivity of the pixel.

FIG. 9K is a cross-sectional view of the improved pixel cell of the present invention after a dielectric is deposited on the fourth metal layer.

FIG. 9L illustrates a cross-sectional view of the improved pixel cell of the present invention after color filter array material has been spun onto the dielectric material, and the CFA lithography processing steps of exposure, development, and bake have been performed.

DETAILED DESCRIPTION OF THE INVENTION

Figure 1:
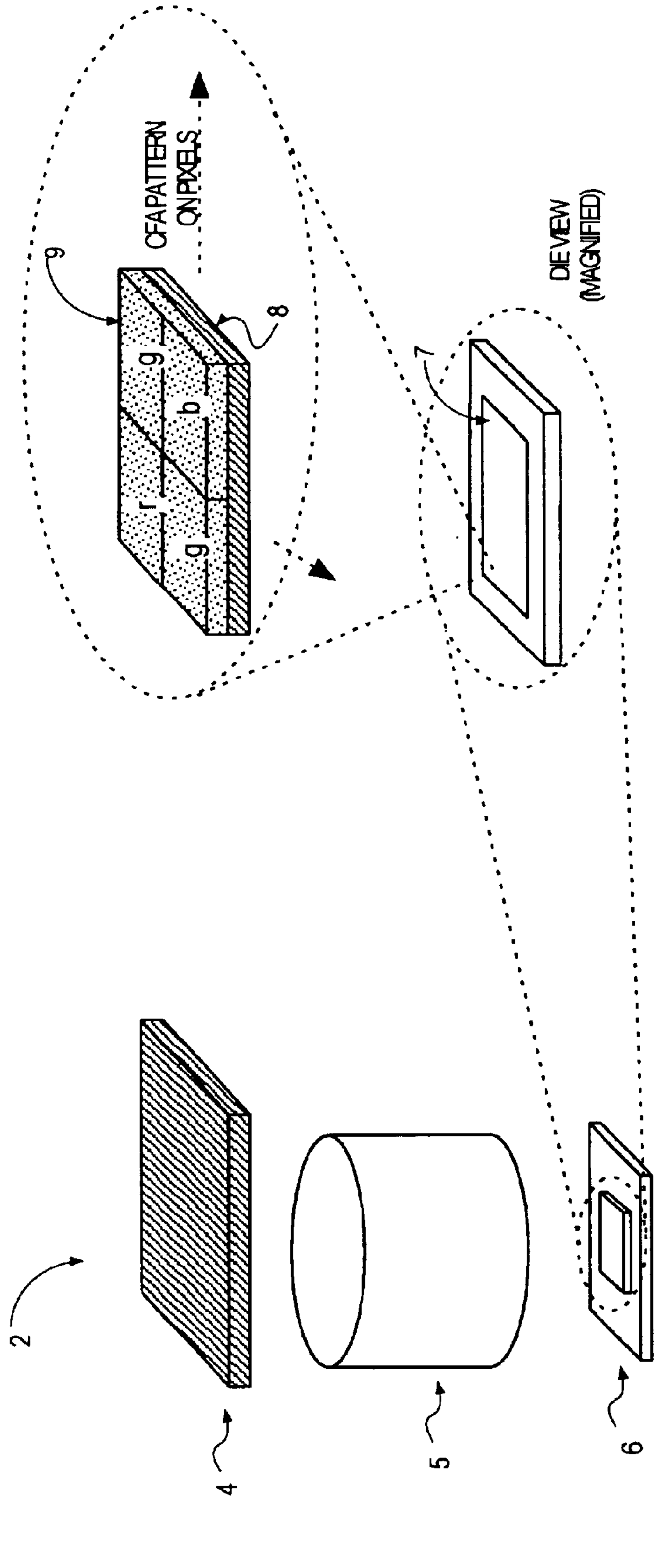
FIG. 1 illustrates an exploded perspective view of a conventional imaging device.

Referring to the figures, exemplary embodiments of the invention will now be described. The exemplary embodiments are provided to illustrate aspects of the invention and should not be construed as limiting the scope of the invention. The exemplary embodiments are primarily described with reference to block diagrams or flowcharts. As to the flowcharts, each block within the flowcharts represents both a method step and an apparatus element for performing the method step. Depending upon the implementation, the corresponding apparatus element may be configured in hardware, software, firmware or combinations thereof.

A method and apparatus to compensate the color pixels for color responsivity variation so that the signal to noise ratio for the different color pixels are approximately equal while preventing saturation of pixels of any one color are disclosed.

The method and apparatus for employing a light shield to modulate color pixel responsivity has numerous applications in the imaging field. The present invention can be advantageously employed to increase the signal to noise ratio of the less sensitive color pixels while preventing the saturation of the more sensitive color pixels. Since the more sensitive color pixels do not saturate, blooming and blooming artifacts are minimized.

Although the presently preferred embodiment employs a metal layer as the light shield, any opaque material that substantially blocks light can be used as a light shield to modulate the color pixel responsivity. Moreover, although in the presently preferred embodiment, the aperture has a generally rectangular shape, apertures having other geometric shapes including, but not limited to, circular pattern, square pattern, can be employed. Furthermore, the aperture can be symmetric or non-symmetric, a single aperture or multiple apertures. The important consideration is that a portion of the light receiving area, as determined by the color responsivity of the pixel and the color responsivity of a second color pixel, is achieved.

Moreover, although the presently preferred embodiment of the present invention describes a three color image capture system and a specific RGB CFA pattern, the teachings of the present invention can be implemented in image capture systems having fewer or more than three colors and other CFA patterns. For example, a four color scheme that employs cyan, white, green and yellow can be used. For further information regarding the cyan, white, green and yellow color scheme, please refer to the article entitled "MOS Solid-State Imager", by Akiya Izumi and Kohichi Mayama, *Hitachi Review*, Vol. 32, No. 3, pp. 125–128 (1983). Similarly, the present invention can be applied to image capture systems having different CFA patterns, such as a cyan, magenta, yellow CFA pattern, The term pixel cell, as used herein, refers to a light sensing circuit and a color filter array (CFA) material overlaid on top of a light sensor. For example, a red pixel refers to a light sensing circuit with a red CFA material overlaid on the light sensor. Similarly, a blue pixel refers to a blue CFA material overlaid on the light sensor. It will be known to those of ordinary skill in the art that a light sensor can include a photodiode and associated circuitry (e.g., transistors) to read out the output of the light sensor.

Figure 2:
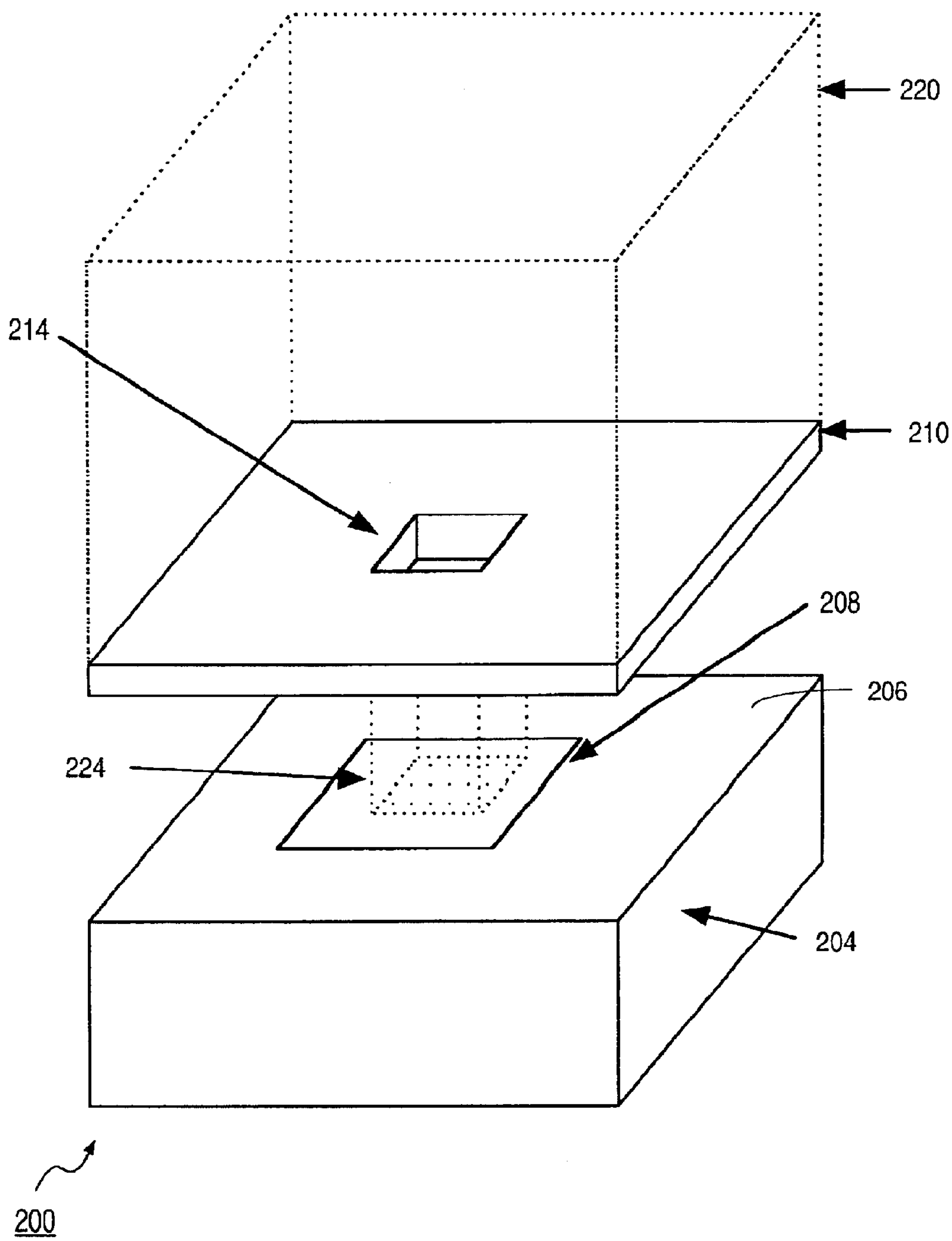
FIG. 2 illustrates an exploded perspective view of a pixel cell configured in accordance to the teachings of one embodiment of the present invention.

FIG. 2 illustrates an exploded perspective view of an improved pixel cell 200 configured in accordance to the teachings of one embodiment of the present invention. The improved pixel cell 200 includes a sensor substrate 204 having active devices and a light sensor. The light sensor receives incident light and converts the incident light into an electrical signal representative of said light. The light sensor can be a photoconductor, a photodetector, a phototransistor or photodiode. For example, a metal semiconductor photodiode such as a PIN structure or a heterojunction photodiode (e.g., GaAs photodiode) can be employed as the light sensor. Similarly, a Schottky diode structure can also be employed as the sensor. Alternatively, a photo-gate structure can also be used as a light sensor.

The sensor substrate includes a photodiode region 208 that is a portion of the pixel cell area 206. The photodiode region 208 has a predetermined light receiving area which can be the entire photodiode region 208 or a portion thereof. The light receiving area corresponds to the area of an opening 214 in a metal layer, which is described hereinafter.

The improved cell 200 includes at least one metal layer 210 that forms an opening 214. The area of this opening 214 is important and can be selectively varied for each different color pixel. Determining the area of the opening 214 is described in greater detail hereinafter with reference to FIG. 4. Although the incident illumination 220 is incident on the entire pixel cell area 206, because of the conductive metal layer 210, the incident illumination 220 only affects the illuminated area 224. It should be noted that the illuminated area 224 for this pixel cell is a fraction of the entire photodiode region 208. In this embodiment, the metal one (I) layer is employed as a light shield to affect the color responsivity of the pixel cell.

Figure 3:
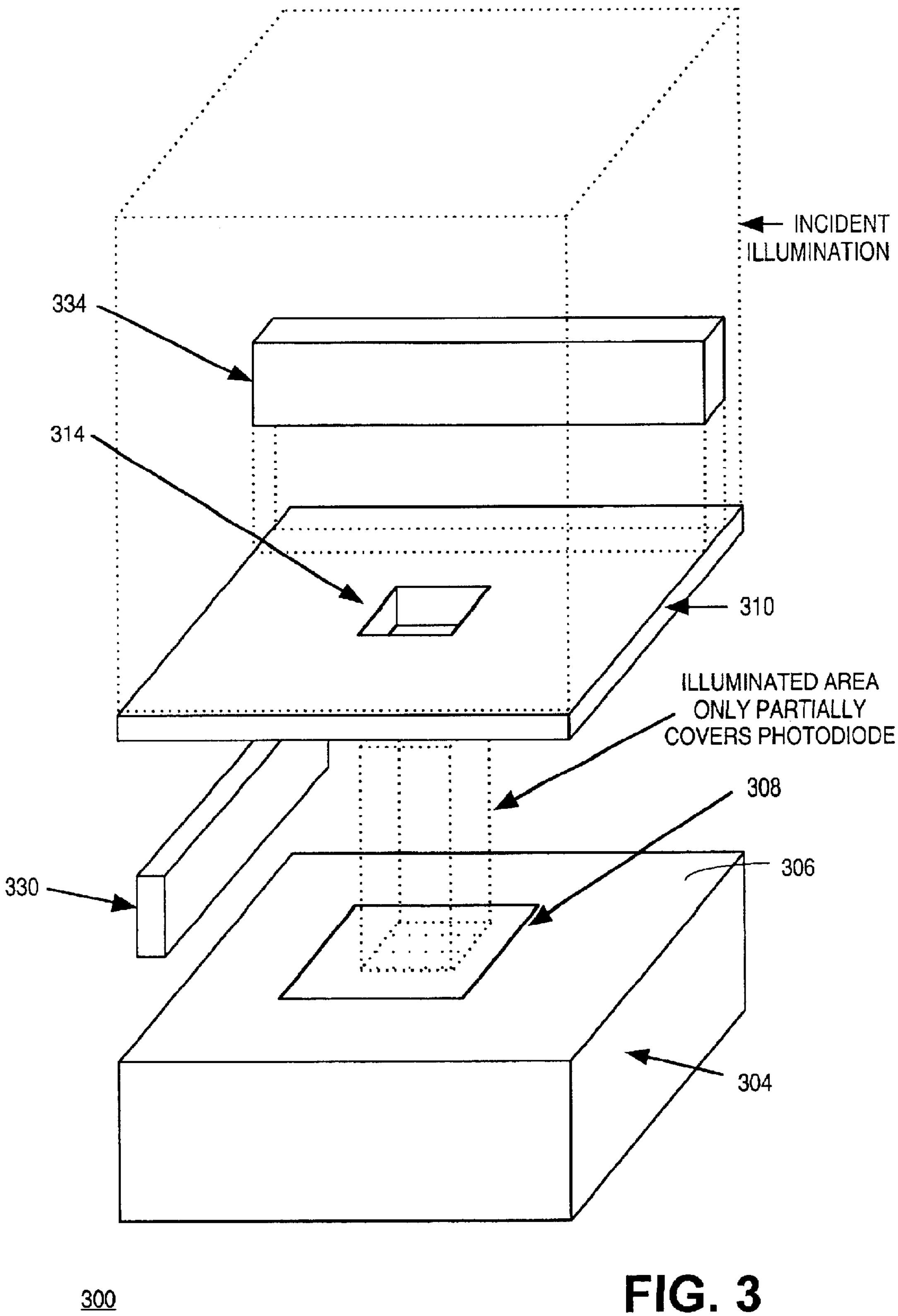
FIG. 3 illustrates an exploded perspective view of the pixel cell configured in accordance to the teachings of an alternative embodiment of the present invention.

FIG. 3 illustrates an exploded perspective view of an improved pixel cell 300 configured in accordance to the teachings of an alternative embodiment of the present invention. The improved pixel cell 300 includes a sensor substrate 304 having active devices and a photodiode. The sensor substrate 304 includes a photodiode region 308 that is a portion of the pixel cell area 306. A conductive metal layer 310 forms an opening 314 and acts as a light shield. In this embodiment, the light shield is the metal two (II) layer. A metal one (I) layer 330, a metal three (III) layer 334, and a metal four (IV) layer (not shown) are employed in this process for local interconnect. It should be noted that any one of the metal layers (metal I, metal II, metal III, metal IV) can be employed as the light shield.

It is important that the metal layers that are not employed as the light shield not intrude into the photodiode region not covered by the light shield. It is preferable that metal layers above the light shield metal layer be kept as far removed as practical from the opening 314, to minimize any unintended losses due to shadowing or diffractive effects. The metal layers below the light shield layer are restricted from intruding into the photodiode region not covered by the light shield. It is not necessary that uniform openings be simultaneously fabricated in all of the metal layers.

Figure 4:
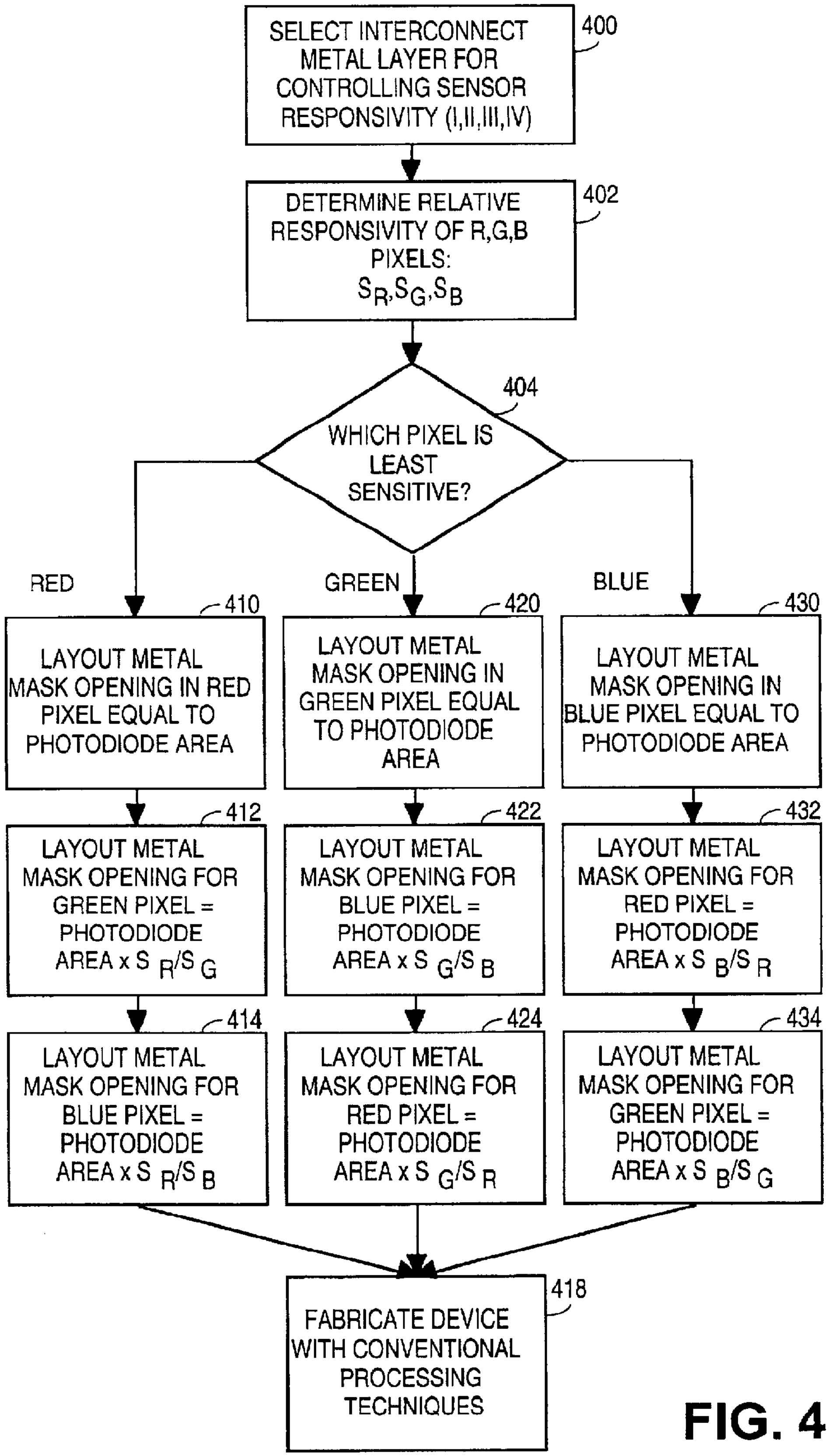
FIG. 4 is a flowchart illustrating a method of determining the area of openings in a metal mask that is used to pattern a metal layer above each color pixel cell in accordance with one embodiment of the present invention.

FIG. 4 is a flowchart illustrating a method of determining the area of openings in a metal mask for each color pixel cell in accordance with one embodiment of the present invention. In processing step 400, one of the metal layers (metal I, metal II, metal III or metal IV) is selected to control the pixel cell responsivity. In processing step 402, a determination is made of the relative responsivity of the color pixels. In the example where there are three color pixels (e.g., red pixels, green pixels and blue pixels), a determination is made of the relative responsivities of the R, G, B pixels (i.e., $S_R$, $S_G$, $S_B$ are determined). In decision block 404, a determination is made as to which of the color pixels is least sensitive to light.

If it is determined that the red pixels are least sensitive to light, processing proceeds to step 410. In processing step 410, the metal mask employed to form the metal above the red pixels is configured to have an opening with an area substantially equal to the predetermined light receiving area for all red pixels. In processing step 412, the metal mask employed to form the metal above the green pixels is configured to have an opening having an area substantially equal to the predetermined light receiving area adjusted by a reduction factor. In this embodiment, the reduction factor is the result of an arithmetic operation between $S_R$ and $S_G$, and the light receiving area is multiplied by the reduction factor. The reduction factor can be substantially equal to $S_R/S_G$. In processing step 414, the metal mask employed to pattern the metal above the blue pixels is configured to have an opening having an area substantially equal to the predetermined light receiving area adjusted by a reduction factor. In this embodiment, the reduction factor is the result of an arithmetic operation between $S_R$ and $S_B$, and the light receiving area is multiplied by the reduction factor. The reduction factor can be substantially equal to $S_R/S_B$. In processing step 418, the sensor device is fabricated by employing conventional processing techniques.

If the green pixel is least sensitive, in processing step 420, the metal mask employed to form the metal above green pixels is configured to have an opening having an area substantially equal to the predetermined light receiving area. In processing step 422, the metal mask employed to form the metal above blue pixels is configured to have an opening having an area substantially equal to the predetermined light receiving area adjusted by a reduction factor. In this embodiment, the reduction factor is the result of an arithmetic operation between $S_G$ and $S_B$, and the light receiving area is multiplied by the reduction factor. The reduction factor can be substantially equal to $S_G/S_B$. In processing step 424, the metal mask employed to pattern the metal above red pixels is configured to have an opening having an area substantially equal to the predetermined light receiving area adjusted by a reduction factor. In this embodiment, the reduction factor is the result of an arithmetic operation between $S_G$ and $S_R$, and the light receiving area is multiplied by the reduction factor. The reduction factor can be substantially equal to $S_G/S_R$. Processing then proceeds to processing step 414.

If the blue pixels are the least sensitive, in processing step 430, the metal mask employed to pattern the metal above blue pixels is configured to have an opening having an area substantially equal to the predetermined light receiving area. In processing step 432, the metal mask employed to pattern the metal above the red pixels is configured to have an opening having an area substantially equal to the predetermined light receiving area adjusted by a reduction factor. In this embodiment, the reduction factor is the result of an arithmetic operation between $S_B$ and $S_R$, and the light receiving area is multiplied by the reduction factor. The reduction factor can be substantially equal to $S_B/S_R$. In processing step 434, the metal mask employed to pattern the metal above green pixels includes an opening having an area substantially equal to the predetermined light receiving area adjusted by a reduction factor. In this embodiment, the reduction factor is the result of an arithmetic operation between $S_B$ and $S_G$, and the light receiving area is multiplied by the reduction factor. The reduction factor can be substantially equal to $S_B/S_G$.

Figure 5:
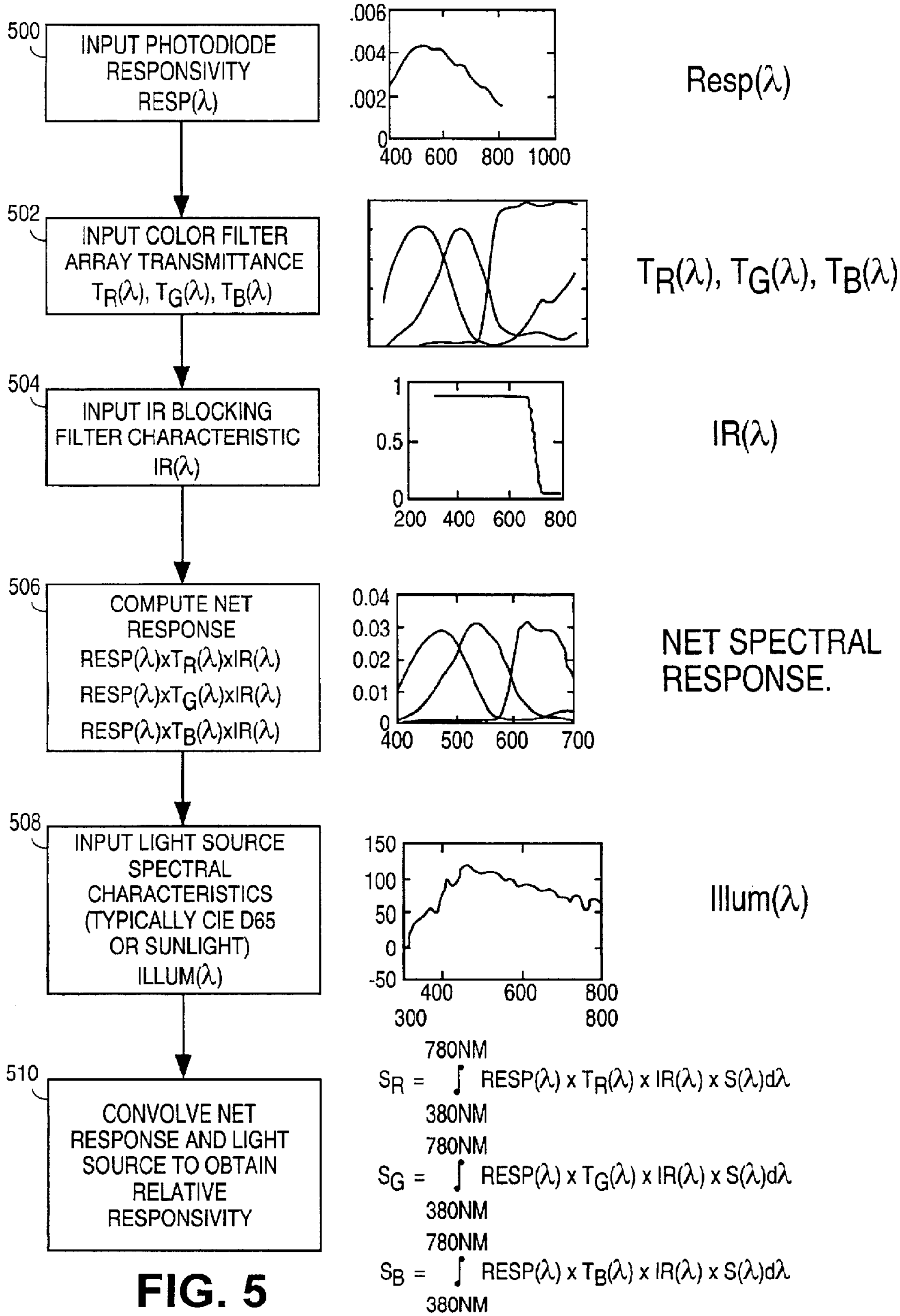
FIG. 5 is a flowchart illustrating a method of determining relative responsivity of the color pixels in accordance with one embodiment of the present invention.

FIG. 5 is a flowchart illustrating the method steps for determining pixel responsivity in accordance with the teachings of the present invention. In processing step 500, the input photodiode responsivity (Resp(λ)) is determined. In processing step 502, input color filter array transmittance for each color $T_R(\lambda)$, $T_G(\lambda)$, $T_B(\lambda)$ is determined. In processing step 504, the input IR blocking filter characteristics (IR(λ)) are determined. In processing step 506, a net spectral response is computed. The net response is simply the responsivity multiplied by the input color filter array transmittance multiplied by the input IR blocking filter characteristic. In processing step 508, the input light source spectral characteristics are determined. The input light source spectral characteristics are conventionally CIE D65 or sunlight. In processing step 510, the net response, calculated in processing step 506, is convolved with the input light source characteristics, determined in processing step 508, to obtain a relative responsivity for each color (i.e., $S_R$, $S_G$ and $S_B$ are determined).

Figure 6:
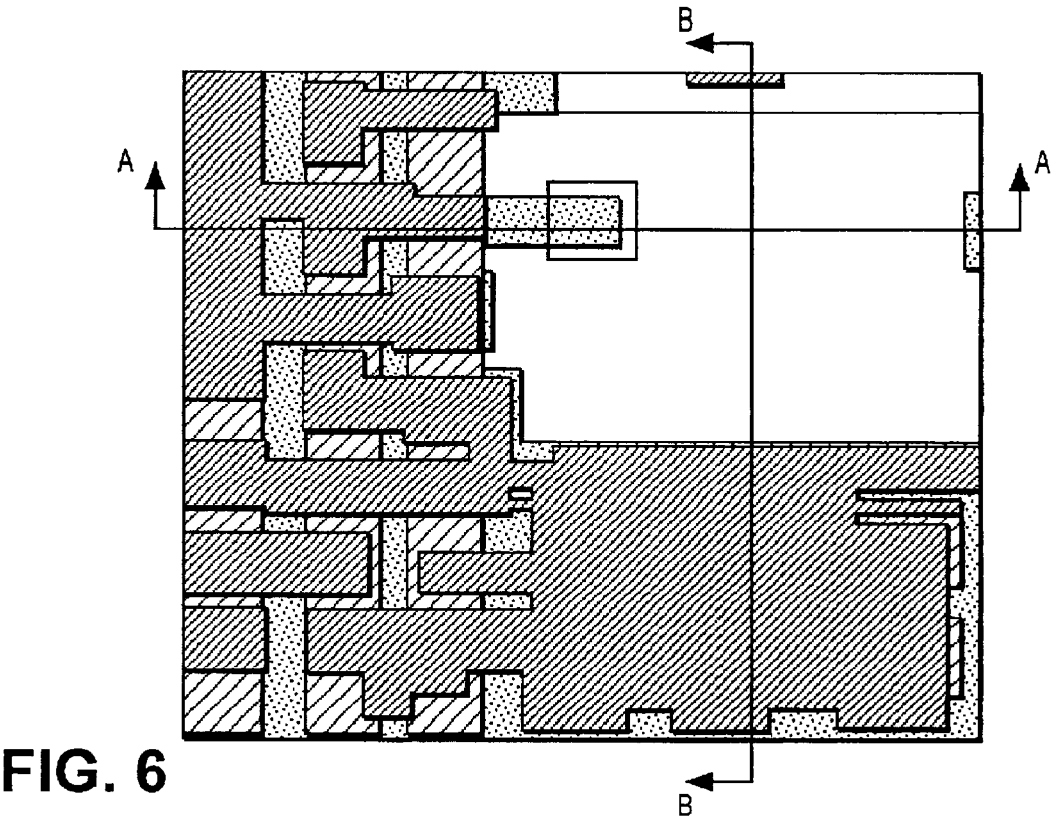
FIG. 6 illustrates a top view of the improved pixel cell before a metal shield layer is deposited thereon.

FIG. 6 illustrates a top view of the improved pixel cell before a metal shield layer is deposited thereon.

Figure 7:
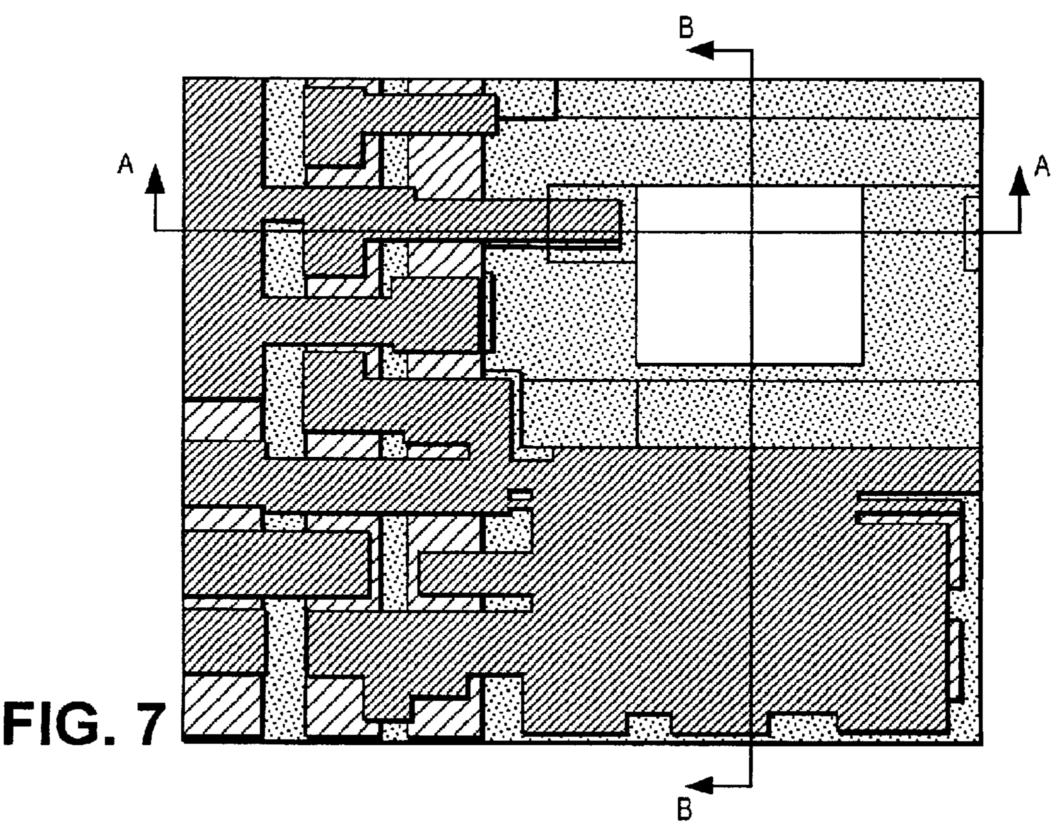
FIG. 7 illustrates a top view of the improved pixel cell of the present invention after a metal shield layer is deposited thereon.

FIG. 7 illustrates a top view of the improved pixel cell of the present invention after a metal shield layer is deposited thereon.

Figure 8A:
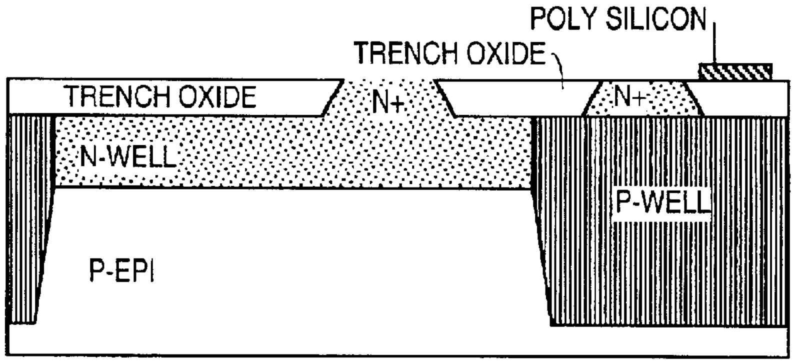
FIGS. 8A–8D illustrate a cross-sectional view through A—A of the improved pixel cell of the present invention, where the first metal layer is employed as a light shield.
Figure 8B:
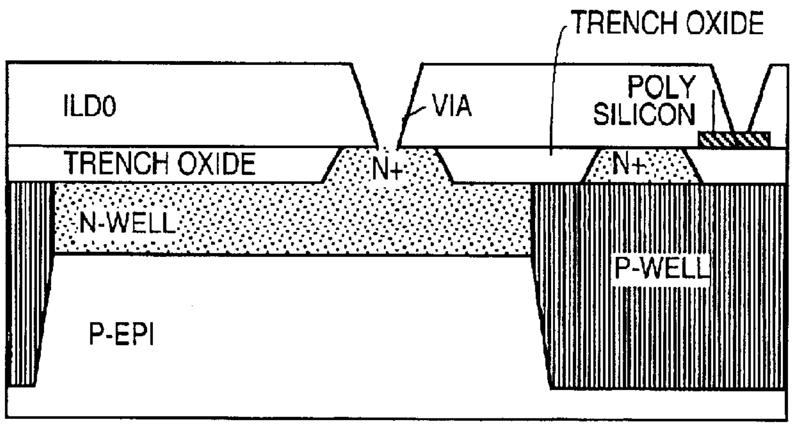
Figure 8C:
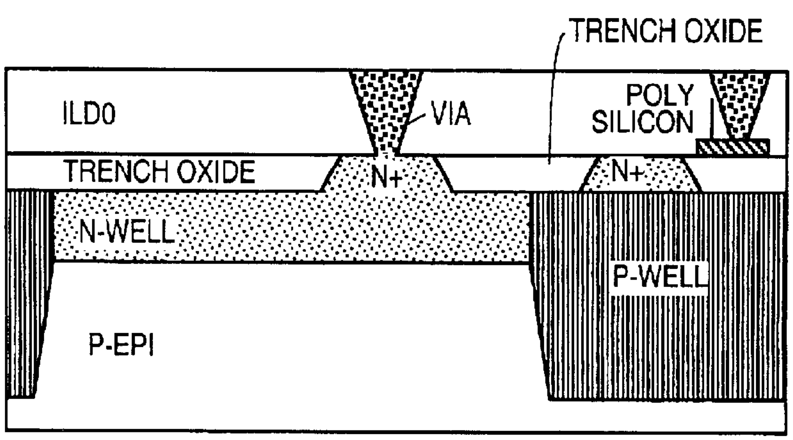
Figure 8D:
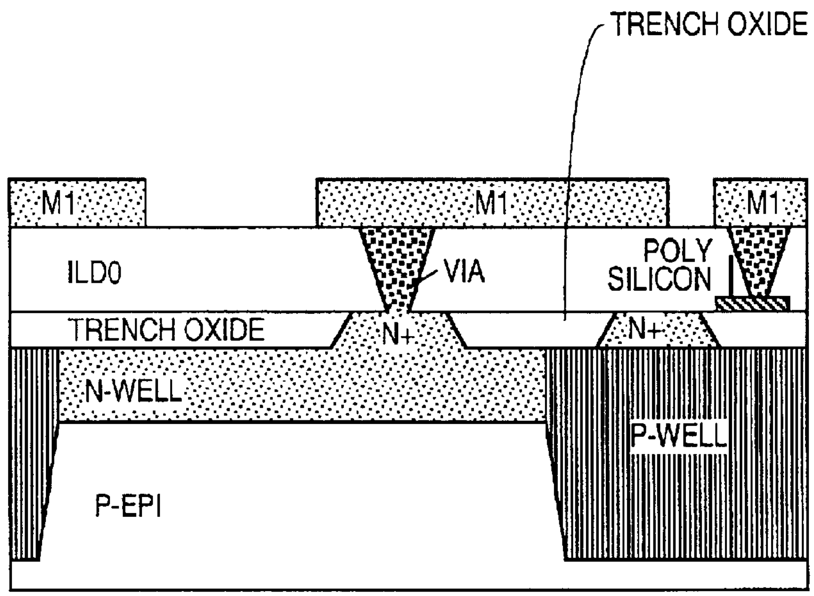

FIGS. 8A–8C illustrate a cross-sectional view of the improved pixel cell of the present invention through A—A of FIG. 6, and FIG. 8D illustrates a cross-sectional view of the improved pixel cell of the present invention through A—A of FIG. 7, where the first metal layer is employed as a light shield.

FIG. 8A illustrates a cross-sectional of the improved pixel cell of the present invention after fabrication of active devices by conventional processing methods. The photodiode is formed by the N-well and P-region, and the trench oxide provides a transparent opening to receive light.

FIG. 8B illustrates a cross-sectional of the improved pixel cell of the present invention after a first dielectric layer (herein referred to as an inter-layer dielectric (ILD0)) is deposited on the substrate and via lithography and etch has been performed. Via lithography involves coating the dielectric layer with a photoresist material, exposing the photoresist material through a mask, and removing the exposed photoresist in a developing step. The via etch involves transferring the mask pattern from the photoresist material to the first dielectric layer. The etching step also involves the removal of the photoresist material. Via lithography and etch are well known in the art and employ conventional processing steps and processing equipment.

FIG. 8C illustrates a cross-sectional view of an improved pixel cell of the present invention after chemical vapor deposition (CVD) of a metal (e.g., tungsten) in the vias and a metal polish.

FIG. 8D illustrates a cross-sectional view of the improved pixel cell of the present invention where the first metal layer (M1) is used as a metal shield to modify the color responsivity of the pixel. As is seen in FIG. 8D, the metal one layer is configured to restrict the amount of incident light on the predetermined light receiving area.

Figure 9A:
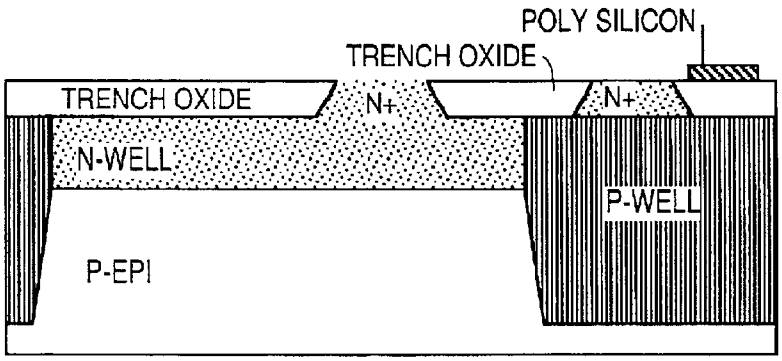
FIGS. 9A–9L illustrate a cross-sectional view through A—A of the improved pixel cell of the present invention, where the fourth metal layer is employed as a light shield.
Figure 9B:
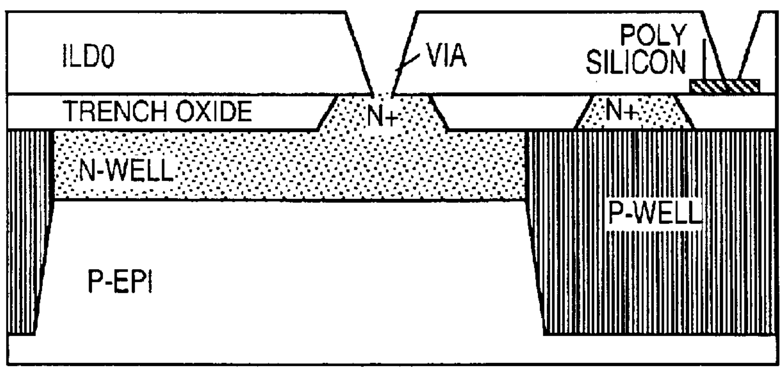
Figure 9C:
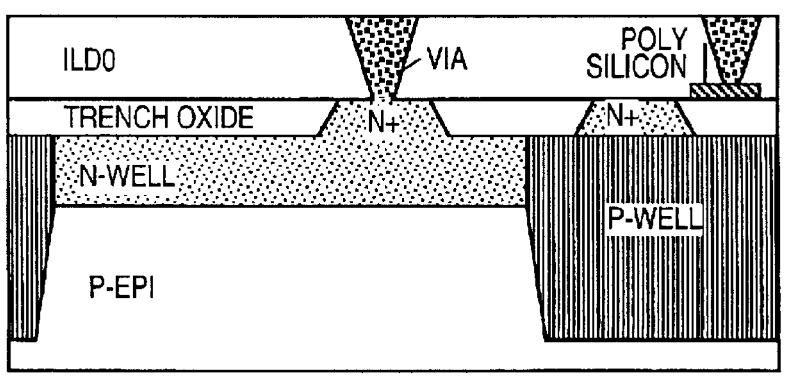

FIGS. 9A–9L illustrate a method of manufacturing the improved pixel cell of the present invention where a metal four layer is employed as a light shield. FIGS. 9A–9L are sectional views through A—A of FIG. 6 and FIG. 7. FIGS. 9A–9C are identical to FIGS. 8A–8C and the structures shown therein are made with the same processing steps.

Figure 9D:
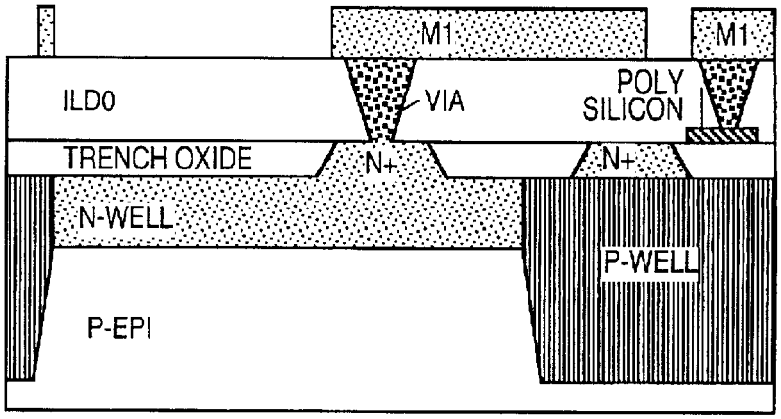

FIG. 9D illustrates a cross-sectional view of the improved pixel cell of the present invention after a metal one layer has been deposited, and the metal one layer lithography and etch processing steps have been performed.

Figure 9E:
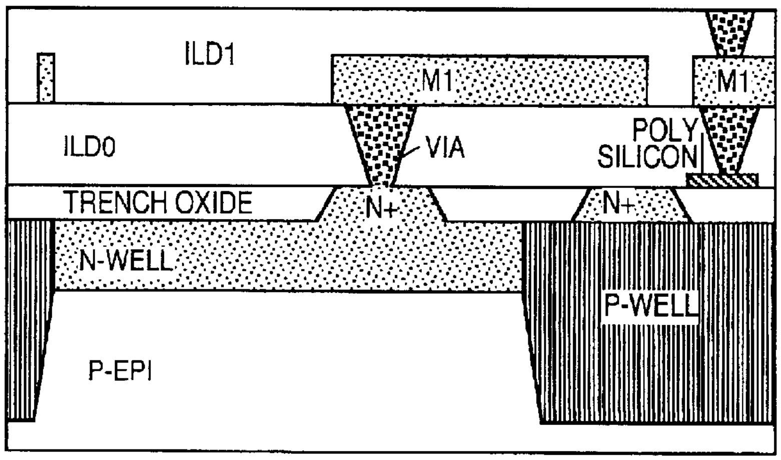

FIG. 9E illustrates a cross-sectional view of the improved pixel cell of the present invention after 1) a second dieletric layer (IDL1) has been deposited and polished; 2) a via one lithography and etch processing steps have been performed; and 3) a CVD metal deposition and polish have been performed.

Figure 9F:
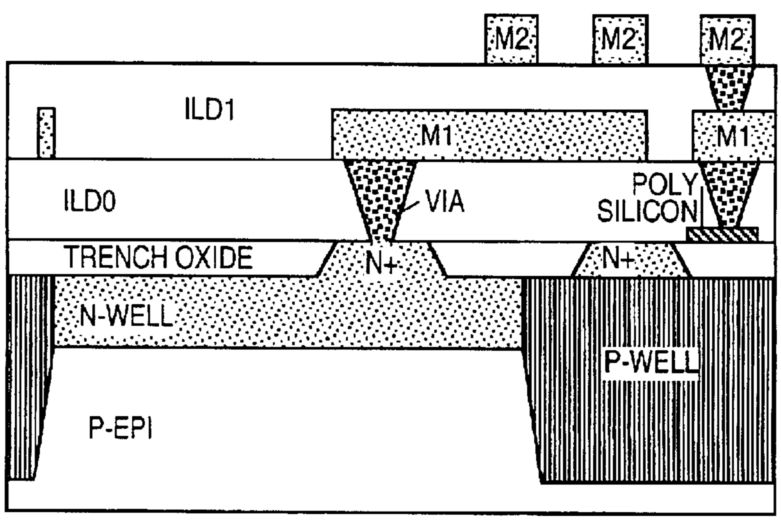

FIG. 9F illustrates a cross-sectional view of the improved pixel cell of the present invention after a metal two layer has been deposited, and metal two lithography and etch have been accomplished.

Figure 9G:
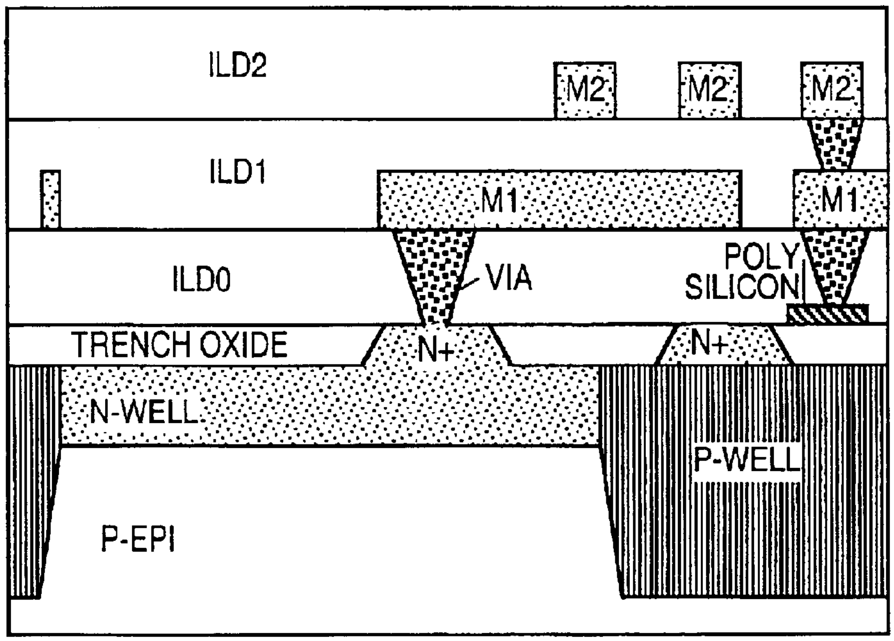

FIG. 9G illustrates a cross-sectional view of the improved pixel cell of the present invention after 1) a third dielectric layer (IDL2) has been deposited and polished; 2) via two lithography and etch steps are also performed (although not shown in this cross-sectional view); and 3) a CVD deposition and polish of a metal, such as tungsten, is also performed (although not shown in this cross-sectional view).

Figure 9H:
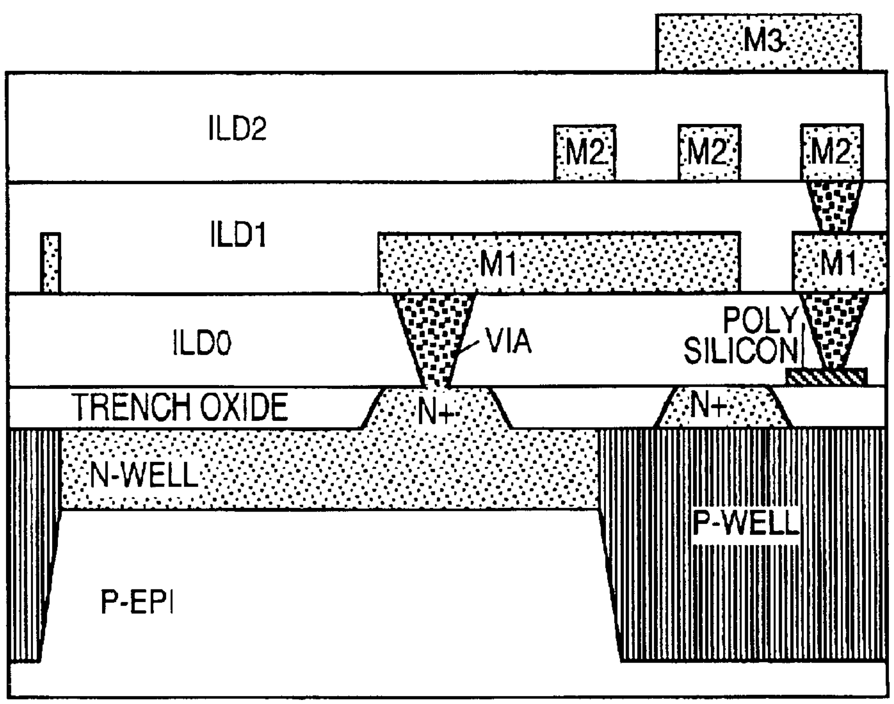

FIG. 9H illustrates a cross-sectional view of the improved pixel cell of the present invention after a metal three layer has been deposited, and the metal three lithography and etch processing steps have been performed.

Figure 9I:
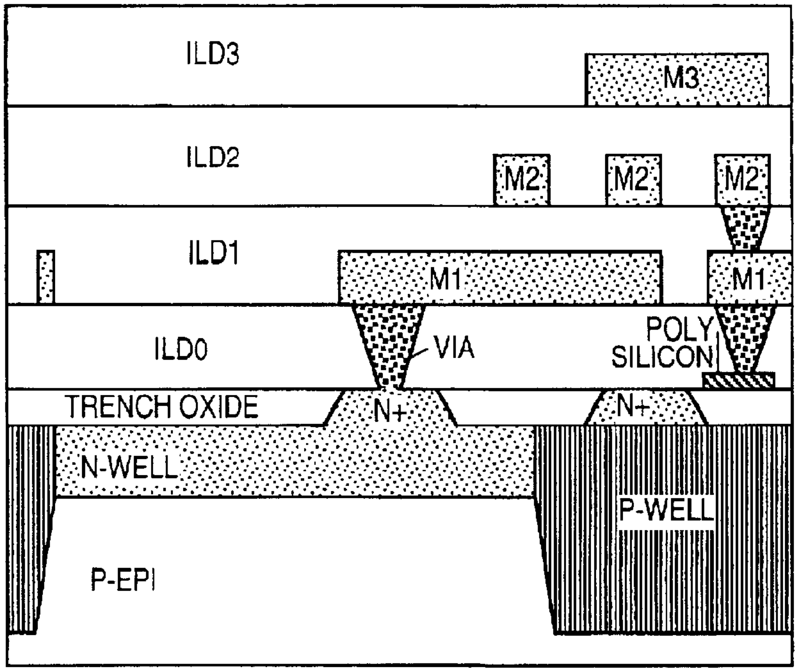

FIG. 9I illustrates a cross-sectional view of the improved pixel cell of the present invention after 1) a fourth dielectric layer (IDL3) has been deposited and polished; 2) a via three lithography and etch processing steps are also performed (although not shown in this cross-sectional view); and 3) a CVD deposition of metal and corresponding polish is also performed (although not shown in this cross-sectional view).

Figure 9J:
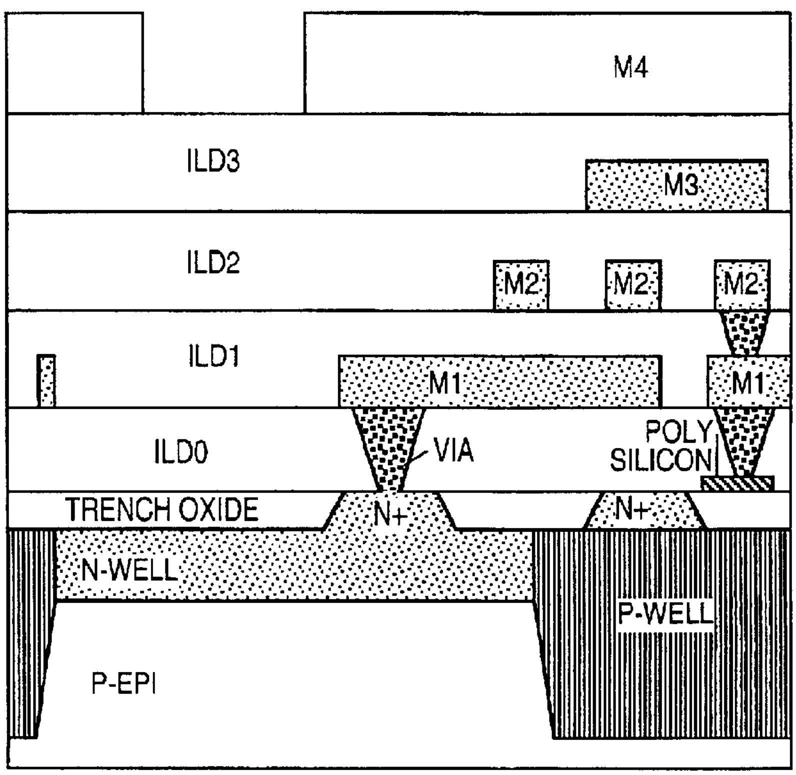

FIG. 9J illustrates a cross-sectional view of the improved pixel cell of the present invention where the fourth metal layer (M4) is employed as a light shield to modify the color responsivity of the pixel.

Figure 9K:
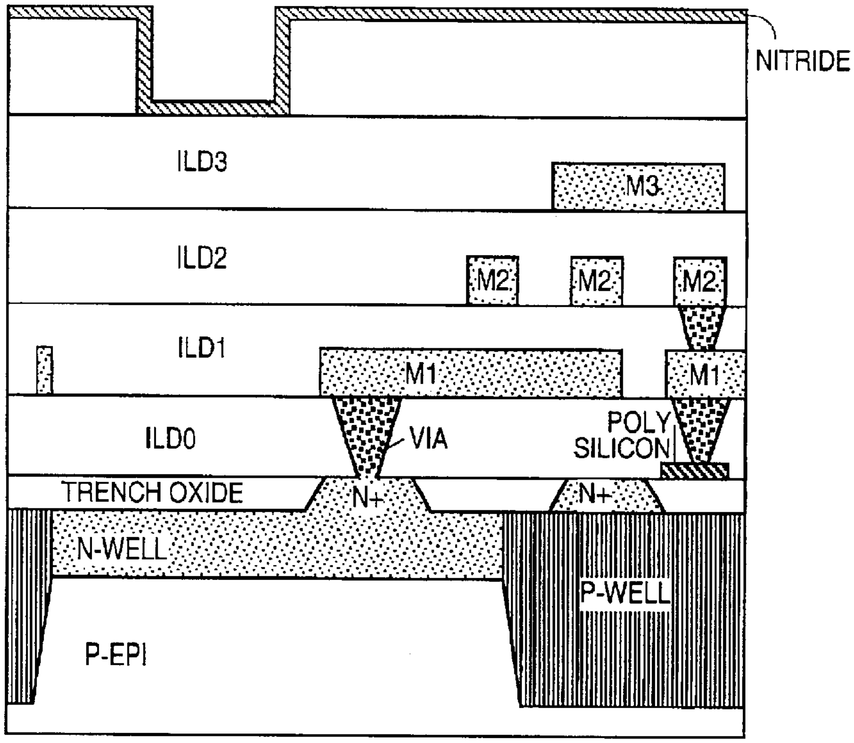

FIG. 9K is a cross-sectional view of the improved pixel cell of the present invention after a dielectric, such as silicon nitride, is deposited on the fourth metal layer. The silicon nitride is used as passivation to prevent sodium and moisture from attacking the die.

Figure 9L:
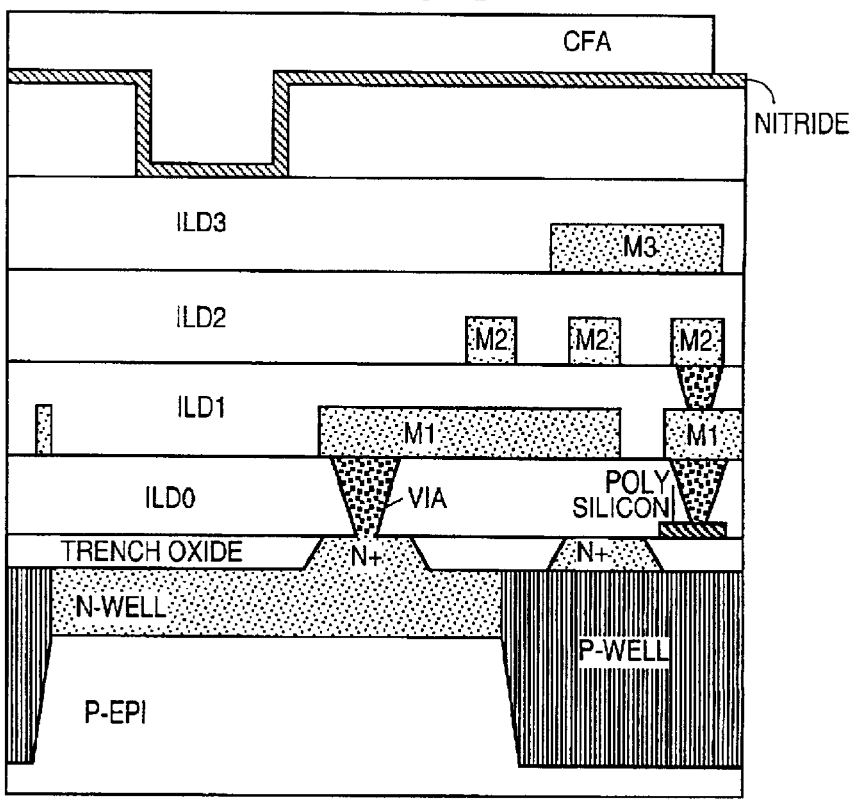

FIG. 9L illustrates a cross-sectional view of the improved pixel cell of the present invention after color filter array material has been spun onto the silicon nitride layer, and the CFA lithography processing steps of exposure, and development and CFA bake have been performed.

It will be understood by those skilled in the art that the CFA spin code, lithography and bake process is repeated as many times as there are different colors in the color filter array (CFA). For example, if the color filter array employs a red color, green color, and blue color, the CFA processing steps are repeated three times.

Figure 10A:
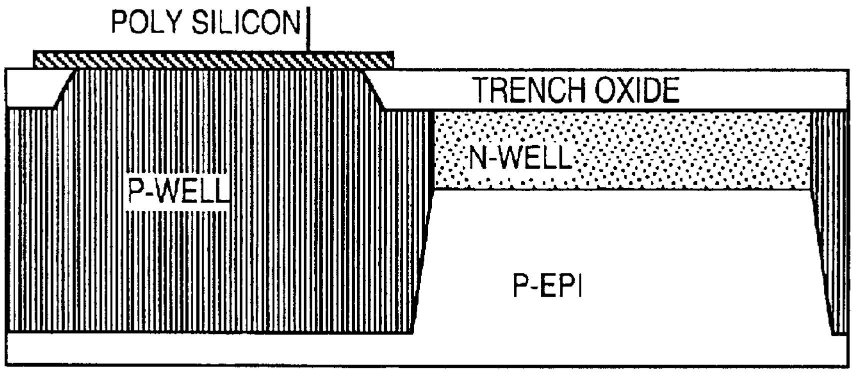
FIGS. 10A–10C illustrate a cross-sectional view through B—B of the improved pixel cell of the present invention where the first metal layer is employed as a light shield.
Figure 10B:
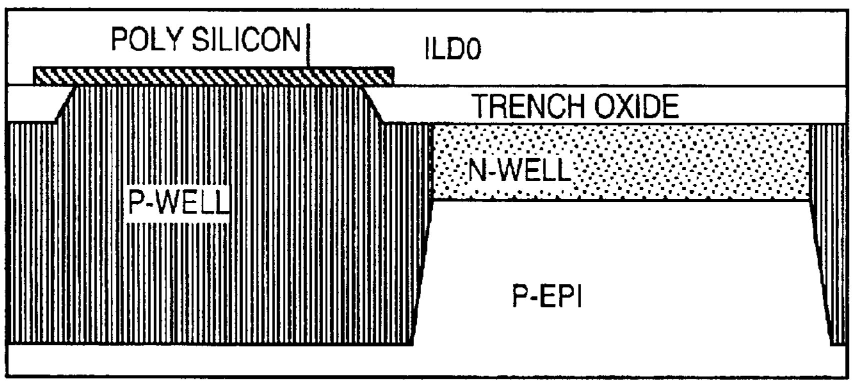
Figure 10C:
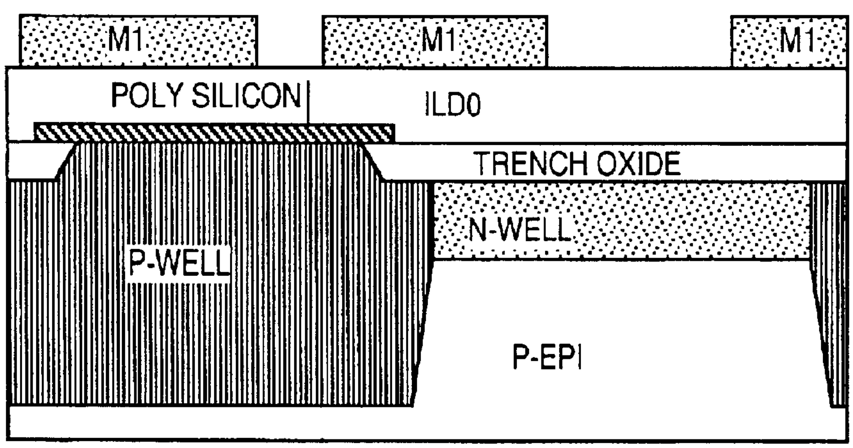
Figure 11A:
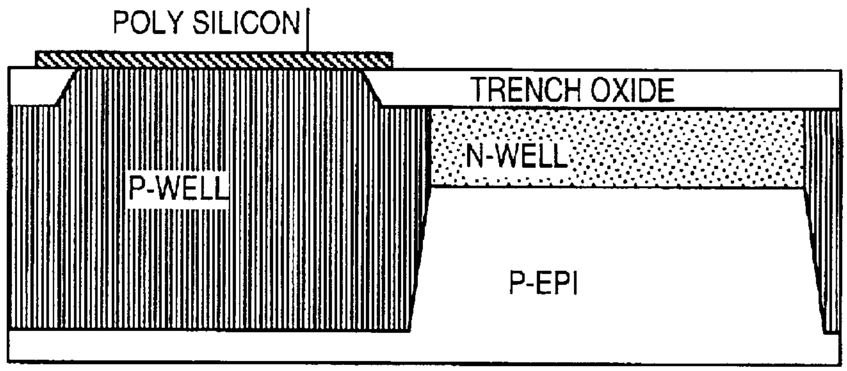
FIGS. 11A–11K illustrate the cross-sectional views through B—B of the improved pixel cell employing the metal four layer as a light shield.
Figure 11B:
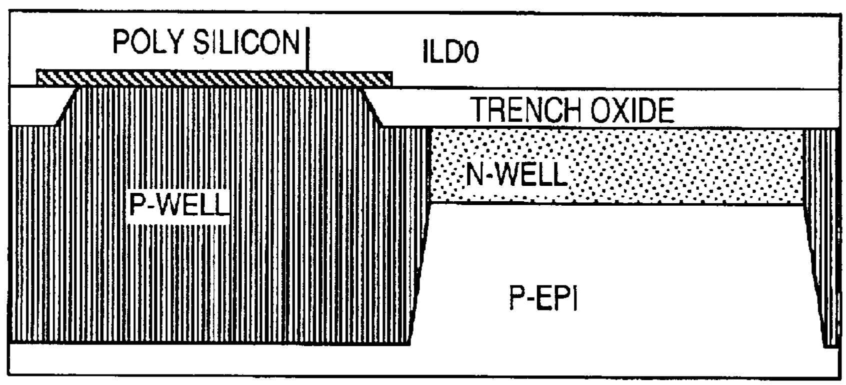
Figure 11C:
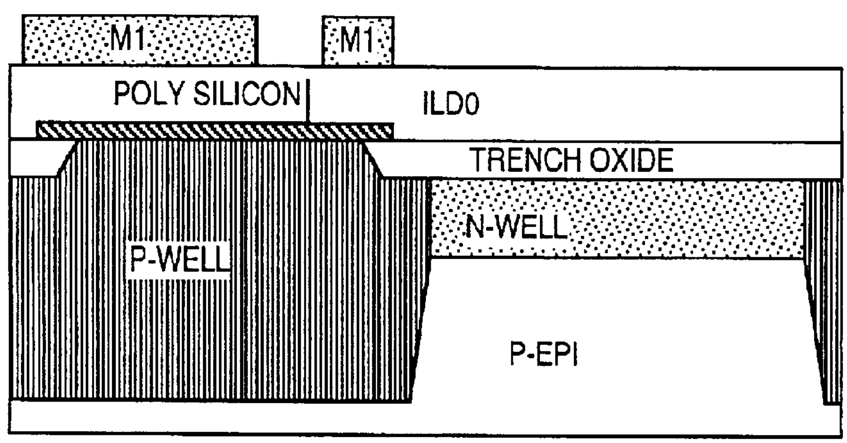
Figure 11D:
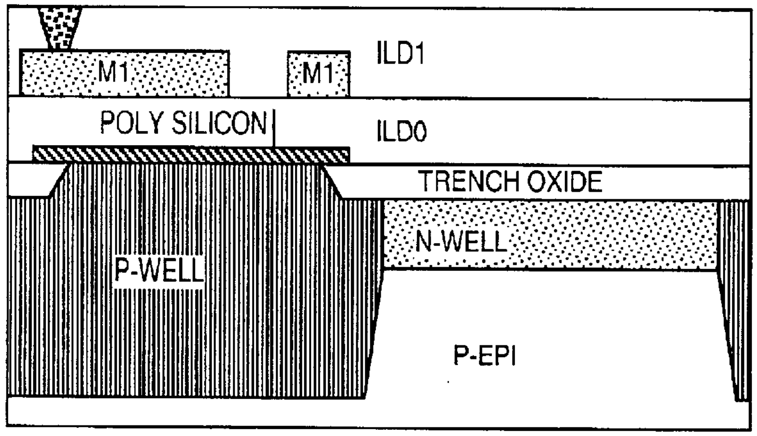
Figure 11E:
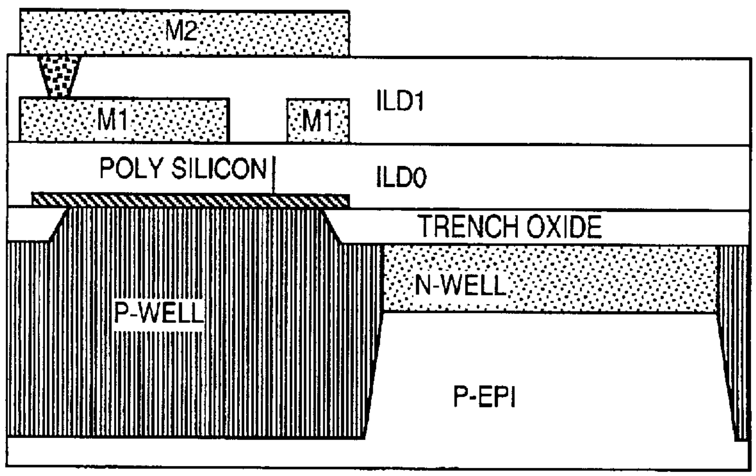
Figure 11F:
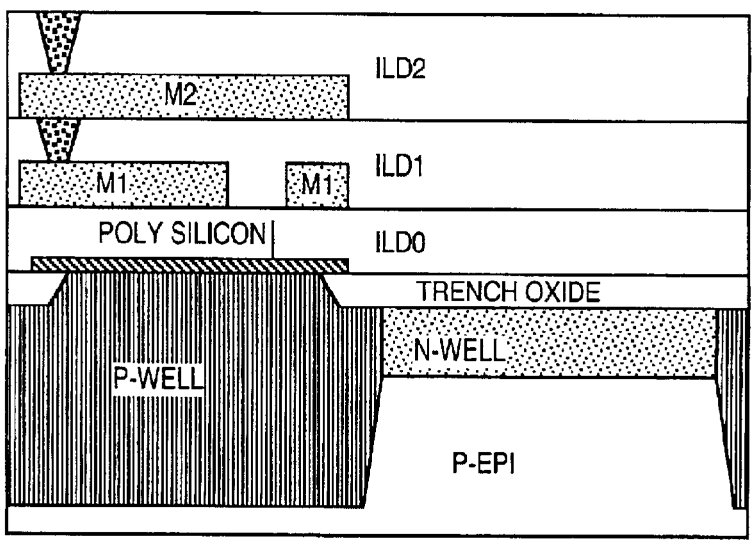
Figure 11G:
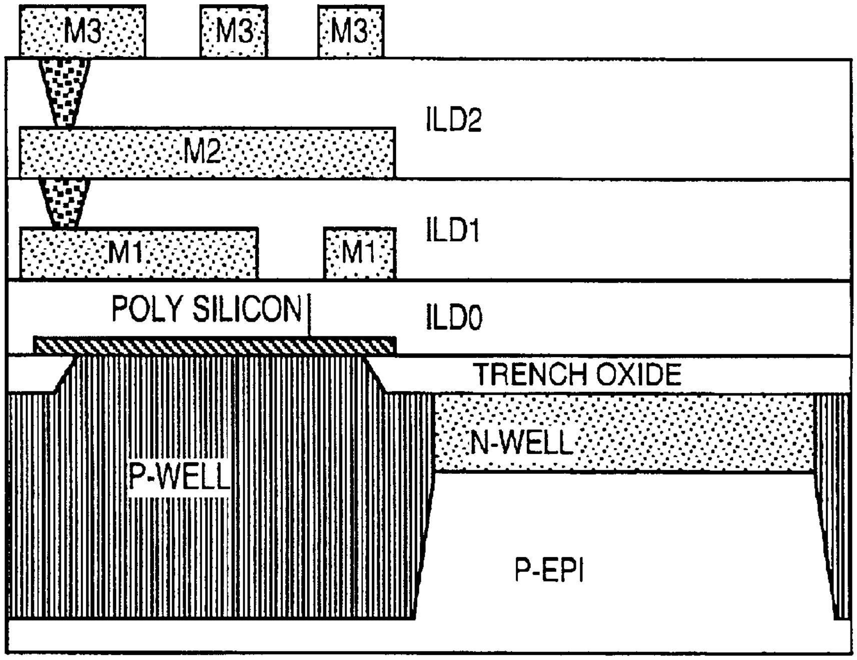
Figure 11H:
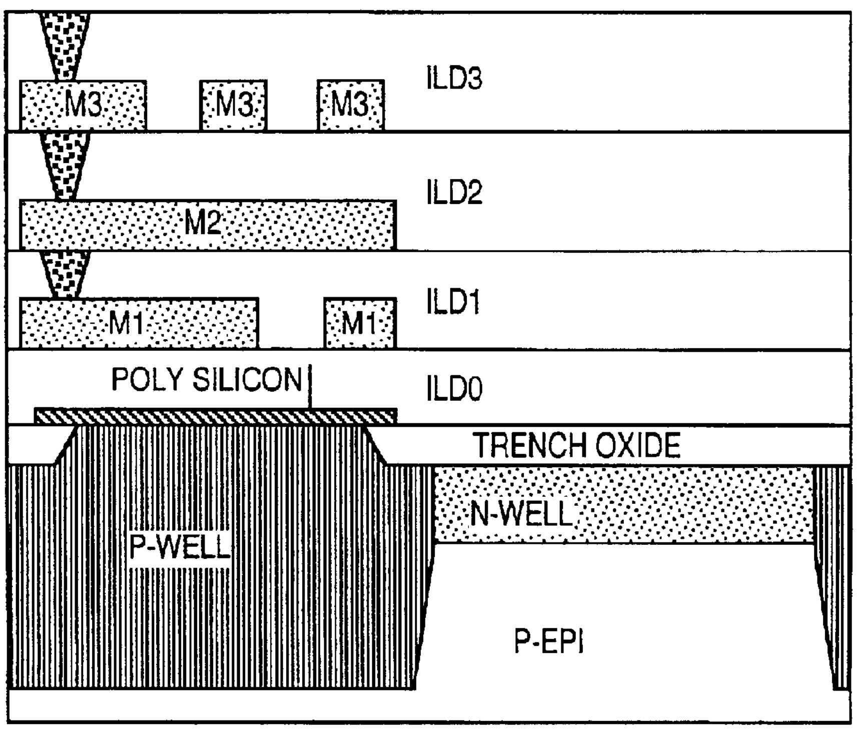
Figure 11I:
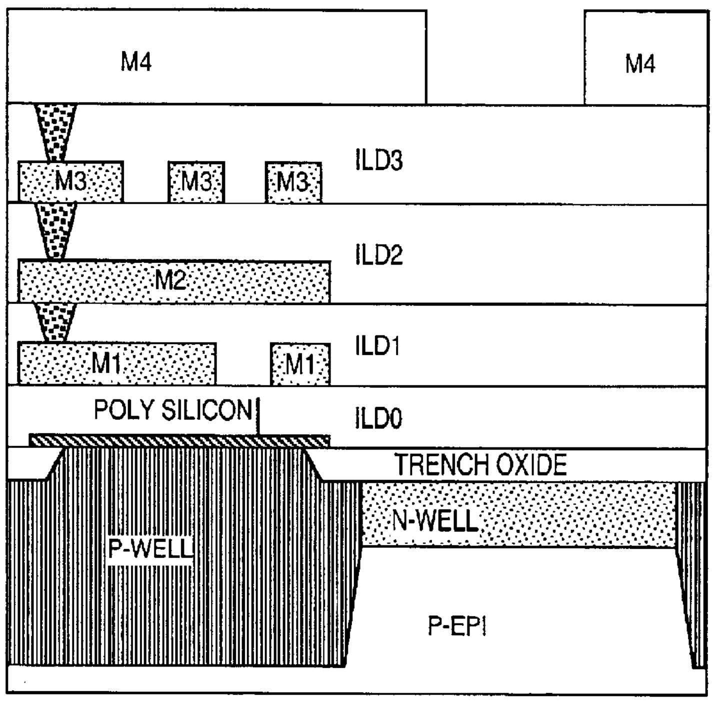
Figure 11J:
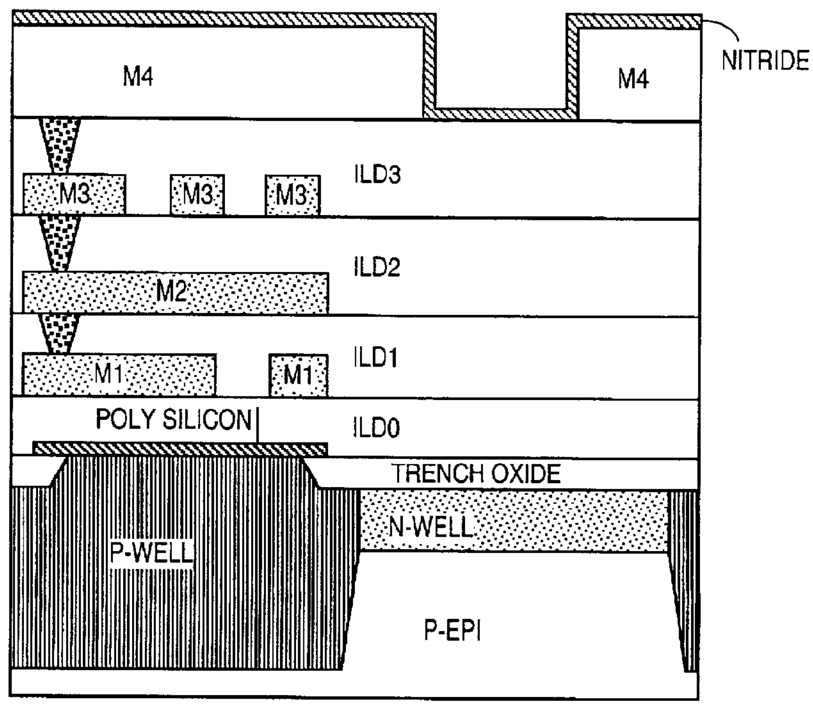
Figure 11K:
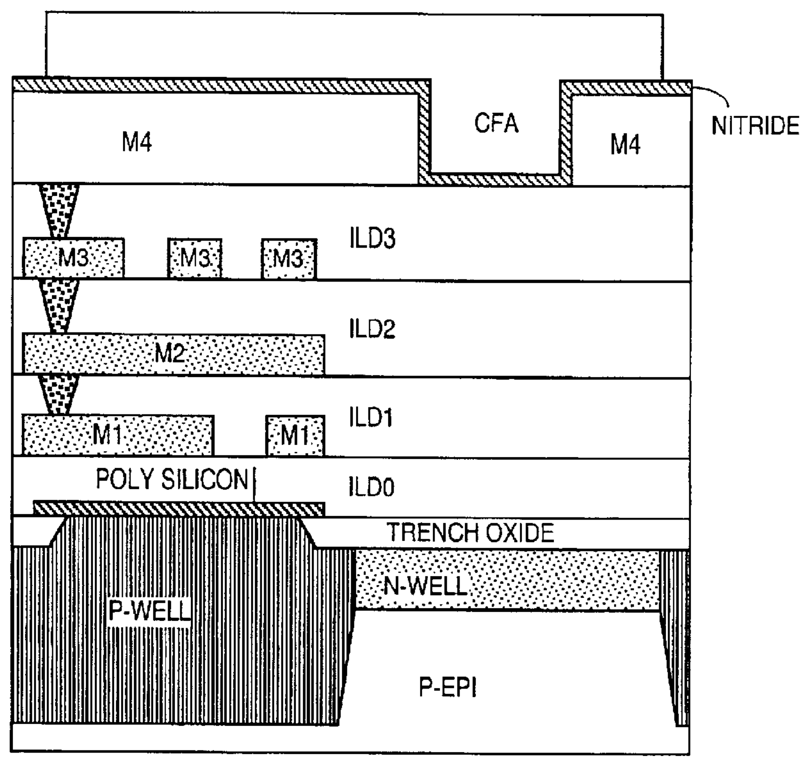

FIGS. 10A–10C illustrate a cross-sectional view through B—B of the improved pixel cell of the present invention where the first metal layer is employed as a light shield.

FIGS. 11A–11K illustrate the cross-sectional views through B—B of the improved pixel cell employing the metal four layer as a light shield.

Since the processing steps illustrated in FIGS. 10A–10C and FIGS. 11A–K correspond generally to the process flow described with reference to FIGS. 8A–8D and 9A–9L, the description of the processing steps are not repeated herein.

The teachings of the present invention modify the design principles for conventional pixel layout. Whereas in conventional pixel layouts, the metal layers are used exclusively for electrical connection, the present invention teaches that one of the metal layers can be used for both interconnect and as an optical element to modulate the color responsivity of pixels. Moreover, whereas conventional layout rules specifically avoid intrusion into the region above the photodiode, the present invention teaches deliberately routing one level of metal to selectively intrude into the region above the photodiode to reduce incident light and modulate the color responsivity of the pixel.

As noted earlier, the metal layers and interconnect above and below the light modulating layer (or the light shield) can intrude into the photodiode region to the extent that the light modulating layer covers the predetermined light receiving area. It is important that the other metal layers do not intrude into the non-covered optical path specified by the light shield layer. It is also important to note that the use of a metal layer for light modulation and as a light shield does not preclude that metal layer for use as an interconnect.

In the preferred embodiment, the pixel is manufactured by an Intel proprietary P854 advanced logic process. Salient features of the P854 process are that it employs multiple metal layers (specifically, four metal layers) and that it exhibits a 0.35 micron ($\mu$m) minimum feature size. For further information regarding the P854 process, please refer to the article entitled "A High Performance 0.35 $\mu$m Logic Technology for 3.3V and 2.5V Operation", by M. Bohr, S. U. Ahmed, L. Brigham, R. Chau, R. Gasser, R. Green, W. Hargrove, E. Lee, R. Natter, S. Thompson, K. Weldon, and S. Yang, IEDM 94-273–276, *Technical Digest. International Electron Devices Meeting*, Authors: International Electron Devices Meeting, IEEE Group on Electron Devices, IEEE Electrical Devices Society; Publisher: New York Institute of Electrical and Electronics Engineers, c1966; Publ. Year: 1994; Catalog Number: 18752. It will be understood by those of ordinary skill in the art that other manufacturing processes can be employed to make the light shield of the present invention.

In the preferred embodiment, the light shield is a metal layer because the metal process is superior to the process for other layers when it comes to small features and control of the actual etching process. For example, the P854 process advanced logic process can be employed to control metal line widths of approximately 0.4 to 1.5 microns, depending on the layer number.

The present invention employs a metal layer as a light shield or a light window. Specifically, the present invention employs the metal layer as a responsivity modulation device. Since the responsivity of a color pixel is proportional to the light energy (e.g., color of the incident light) and also the intensity of the light incident on an exposed area (e.g., photodiode), the present invention employs metal to affect the exposed area (i.e., the area than can receive the photons of light) to compensate for different incident light energy (different colors of light) so as to achieve a balanced response to the light energy distribution expected for a typical scene.

Figure 12:
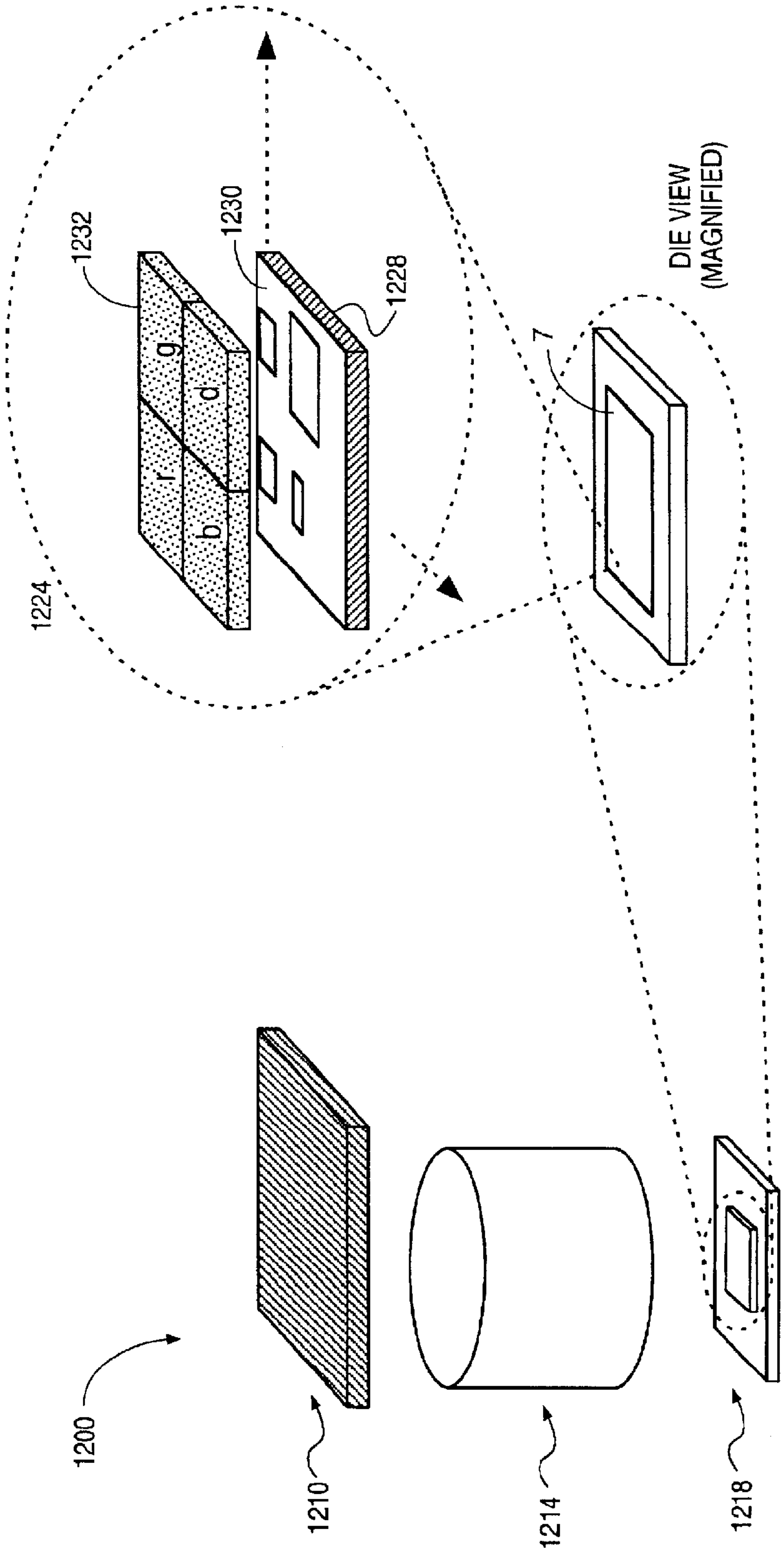
FIG. 12 illustrates a perspective view of an image capture system in which the improved sensor of the present invention can be implemented.

FIG. 12 illustrates a perspective view of an image capture system 1200 in which the improved sensor of the present invention can be implemented. The image capture system 1200 includes an IR blocking filter 1210, a lens assembly 1214 and the imager and package 1218. The imager includes a sensor circuit 1224. The sensor circuit includes a pixel array 1228 having a plurality of pixel cells arranged in rows and columns.

The pixel array, configured with the teachings of the present invention, includes a light shield metal layer 1230 having a plurality of openings where the area of the openings is specifically configured based on the color responsivity of the pixel cell. The pixel array also includes a color filter array 1232 having a plurality of elements. In one embodiment, the color filter array employs three color filter materials (red, green and blue).

In one embodiment, the metal layer includes a plurality of responsivity altering windows, where the windows disposed above the blue pixels are approximately equal to 5 microns by 5 microns, the windows disposed above red and green pixels are approximately 2 microns by 2 micron. The openings employed for controlling the pixel responsivity can range in size from a minimum set by the fabrication process capability to a maximum which results in no blockage of light entering the photodiode (as shown in FIG. 2). It is anticipated that a typical embodiment would require openings ranging from approximately one micron by one micron to 5 microns by 5 microns.

A photosensitive device includes a first area for receiving incident light. The photosensitive device has a responsivity with respect to the wavelength of the incident light. In other words, the responsivity of the photosensitive device is dependent on the wavelength of the incident light. The present invention employs metal to selectively affect the responsivity of the photosensitive device by covering a portion of the area of photodiode. The exposed area of the red pixels, the green pixels and the blue pixels are selectively adjusted so that all of the pixels, regardless of color, saturate at approximately the same time in response to the light energy distribution expected for a typical scene. In order to further increase and enhance the signal to noise ratio of the least sensitive color pixels (i.e., the blue pixels), the present invention allows all the color pixels to be exposed to the light (i.e., control the exposure or integration time) so that all the color pixels saturate at about the same time.

The graph corresponding to step 500 in FIG. 5 is a responsivity versus wavelength curve for an unfiltered pixel (i.e., that is a pixel without any color filter array material disposed thereon). The responsivity is related to the quantum efficiency of the photodiode. The quantum efficiency (sometimes referred to as effective quantum efficiency) is often expressed as a ratio of the number of photoelectrons created by the photoelectric effect to the number of photons incident on the entire pixel area even though the active area (the predetermined light receiving area) is typically less than the entire pixel area. The wavelength refers to the wavelength of the incident light.

The graph corresponding to step 502 of FIG. 5 illustrates a transmittance versus wavelength curve for different color filter materials. One can derive the transmittance versus wavelength curves of a color pixel by convolving the appropriate transmittance versus wavelength curve for that color with a selected responsivity versus wavelength curve. In other words, by convolving the color filter array function (transmissivity or transmittance versus wavelength) and the IR Block Filter chromatics, the sensor responsivity versus wavelength curve (quantum efficiency versus wavelength), a net responsivity versus wavelength curve (see graph associated with step 506) that models the behavior of a color pixel is determined. A fill factor percentage of 31% represents an exposure of the entire active area.

The horizontal axis is the transmittance, which is the fraction of the incident light that reaches the active area. The transmittance may be expressed as a percentage, or as a fraction between 0 and 1. The term, "transmissivity", may be loosely applied by those skilled in the art, although a strict definition of transmissivity is the fraction of light passing through a material per unit thickness. Thus, transmissivity is an intrinsic material property, while transmittance is an extrinsic material property.

Figure 13:
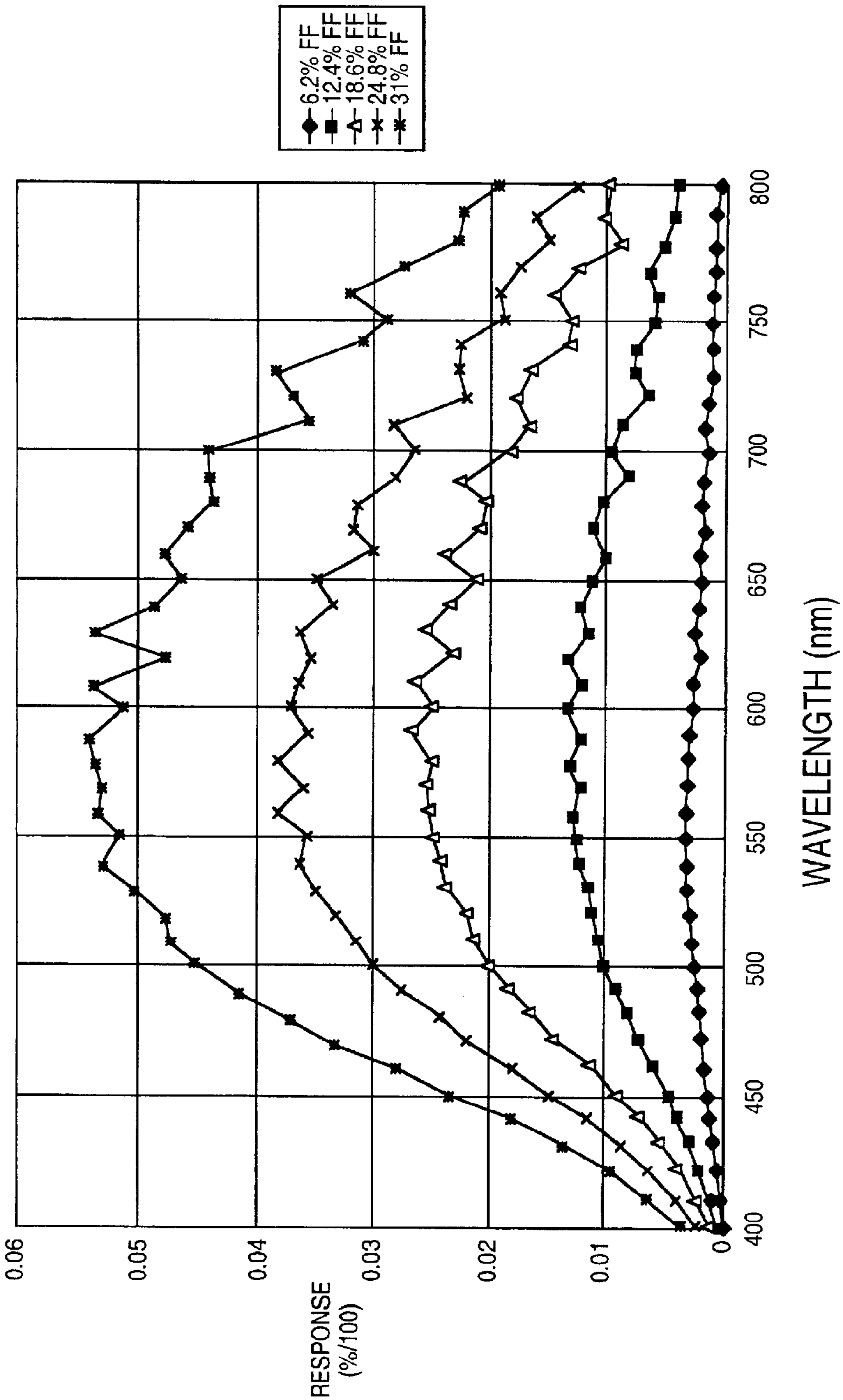
FIG. 13 illustrates a relative response versus wavelength graph.

FIG. 13 is a relative response versus wavelength graph illustrating five curves with each curve corresponding to a fill factor (FF) percentage. This graph illustrates how the present invention reduces the incident light on the photodiode. The fill factor is the percentage of the total pixel area which is open to incident light. A pixel can be divided into an active area (i.e., the area having the circuit element to convert light photons into electrons) and areas where other circuits are located. The fill factor percentage refers to the amount of active area that is uncovered divided by the total pixel area. For example, in this example, an uncovered pixel (i.e., 100% of the total pixel area is exposed to light), the fill factor percentage is approximately 31%. As can be seen from FIG. 13, when the fill factor percentages are approximately 6.2%, only a small fraction of the light is detected. As a general rule, as the fill factor percentage decreases, the amount of light detected by the active area correspondingly decreases.

There are two principal sources of noise: First, there is shot noise that varies with the total number of photons collected. A second source of noise is related to dark current. Both types of noise introduce a statistical uncertainty into the signal captured by the sensor. By increasing the number of photons collected, the shot noise, expressed as a fraction of the captured signal, is reduced. Hence, by lengthening the integration time, shot noise can be reduced.

The second source of noise is dark current. Dark current represents a leakage current that causes the accumulation of stored electrons over the integration period. The electrons contributed from the dark current cannot be distinguished from photoelectrons, and hence are undesirable. However, in a well-designed sensor, the dark current contribution to the signal is smaller than the shot noise. Thus, increasing the number of photoelectrons captured in the least sensitive pixels (by increasing the integration time) benefits the signal to noise ratio. The present invention allows a longer exposure for the benefit of the least sensitive pixels without saturation of the more sensitive color pixels thereby decreasing the shot noise in the image capture system.

The exemplary embodiments described herein are provided merely to illustrate the principles of the invention and should not be construed as limiting the scope of the invention. Rather, the principles of the invention may be applied to a wide range of systems to achieve the advantages described herein and to achieve other advantages or to satisfy other objectives as well.

What is claimed is:

1. A method comprising:

exposing a plurality of photodiodes formed on a first layer of a substrate of an image sensor to a light source;

modifying a light receiving area of a first photodiode and a second photodiode by the use of one or more light shields formed on at least a different second layer of the sensor substrate, such that, for a given size of light receiving area, a first photodiode is exposed to a greater amount of incident light than a second; and wherein modifying the light receiving area comprises modifying on the basis of a responsivity of a color assigned to one of the first photodiode and the second photodiode.

2. The method of claim 1, wherein modifying the light receiving area comprises masking a portion of one of the first photodiode and the second photodiode from incident light.

3. A method comprising:

providing an image sensor comprising a plurality of pixels formed on a first layer of a sensor substrate;

modifying a light receiving area of alternate pixels by the use of one or more light shields formed on at least a different second layer of the sensor substrate, such that, for a given size of light receiving area, a first pixel is exposed to a greater amount of incident light than a second pixel;

capturing an incident light; and wherein modifying the light receiving area comprises modifying on the basis of a responsivity of a color assigned to one of the first pixel and the second pixel.

4. The method of claim 3, wherein modifying the light receiving area comprises masking a portion of one of the first pixel and the second pixel from the incident light.

* * * * *